US008306795B2

(12) United States Patent
Atkinson

(10) Patent No.: US 8,306,795 B2
(45) Date of Patent: Nov. 6, 2012

(54) PRODUCT CONFIGURATION METHOD AND SYSTEM

(75) Inventor: Shane A. Atkinson, Lewisburg, TN (US)

(73) Assignee: Numatics, Incorporated, Novi, MI (US)

( * ) Notice: Subject to any disclaimer, the term of this patent is extended or adjusted under 35 U.S.C. 154(b) by 2030 days.

(21) Appl. No.: 10/252,603

(22) Filed: Sep. 23, 2002

(65) Prior Publication Data

US 2003/0061238 A1 Mar. 27, 2003

Related U.S. Application Data

(60) Provisional application No. 60/325,005, filed on Sep. 25, 2001.

(51) Int. Cl.
*G06F 17/50* (2006.01)
*G06F 7/60* (2006.01)
*G06F 7/48* (2006.01)
*G06F 3/00* (2006.01)
*G06F 9/44* (2006.01)
*G06Q 30/00* (2012.01)
*A01K 5/02* (2006.01)

(52) U.S. Cl. ......... 703/6; 703/1; 703/2; 705/26; 705/27; 705/29; 707/3; 707/4; 707/101; 707/102; 715/708; 715/735; 715/866; 717/105; 717/107

(58) Field of Classification Search .................. 703/6, 1, 703/2; 705/26, 27, 29; 707/3, 4, 101, 102; 715/708, 735, 866; 717/105, 107
See application file for complete search history.

(56) References Cited

U.S. PATENT DOCUMENTS

| | | | | |
|---|---|---|---|---|
| 4,847,761 A | * | 7/1989 | Ferriter et al. | 705/29 |
| 5,260,866 A | * | 11/1993 | Lisinski et al. | 705/29 |
| 5,267,146 A | * | 11/1993 | Shimizu et al. | 703/1 |
| 5,307,261 A | * | 4/1994 | Maki et al. | 705/29 |
| 5,311,424 A | * | 5/1994 | Mukherjee et al. | 705/29 |
| 5,367,627 A | * | 11/1994 | Johnson | 715/708 |
| 5,500,802 A | | 3/1996 | Morris et al. | 364/474.24 |
| 5,515,269 A | * | 5/1996 | Willis et al. | 705/29 |
| 5,515,524 A | * | 5/1996 | Lynch et al. | 703/13 |
| 5,630,025 A | * | 5/1997 | Dolby et al. | 706/46 |
| 5,715,444 A | * | 2/1998 | Danish et al. | 1/1 |
| 5,745,765 A | * | 4/1998 | Paseman | 717/107 |
| 5,825,651 A | * | 10/1998 | Gupta et al. | 700/103 |
| 5,877,966 A | * | 3/1999 | Morris et al. | 716/136 |
| 5,897,639 A | * | 4/1999 | Greef et al. | 705/26.8 |
| 5,963,953 A | * | 10/1999 | Cram et al. | 1/1 |
| 5,983,219 A | * | 11/1999 | Danish et al. | 1/1 |

(Continued)

OTHER PUBLICATIONS

Oh et al. "Mapping Product Structures Between CAD and PDM Using UML" Computer Aided Design 33 pp. 521-529. Apr. 2001.*
Orenstein, David. "QuickStudy: Application Programming Interfaces" Jan. 10, 2000.*
Danish, Sherif. "Building Database-driven Electronic Catalogs", SIGMOD Record, vol. 27, No. 4, Dec. 1998.*

(Continued)

*Primary Examiner* — Shambhavi Patel
(74) *Attorney, Agent, or Firm* — Reising Ethington P.C.

(57) ABSTRACT

An object-oriented product configuration system generally includes a model tool for modeling a particular product line and a runtime tool for making the modeled information available to one or more external software applications. More specifically, the model tool enables a modeler to create a ProductModel object, which is an automatically populating electronic file containing all of the necessary information about a particular product line. Once the ProductModel is created, the runtime tool provides an external application with an interface for accessing and utilizing the information. Thus, a single source can deploy useful information to various types of software applications.

22 Claims, 9 Drawing Sheets

U.S. PATENT DOCUMENTS

| | | | | |
|---|---|---|---|---|
| 6,023,683 | A * | 2/2000 | Johnson et al. | 705/26.62 |
| 6,035,305 | A * | 3/2000 | Strevey et al. | 1/1 |
| 6,055,516 | A * | 4/2000 | Johnson et al. | 705/26.8 |
| 6,110,213 | A * | 8/2000 | Vinciarelli et al. | 703/1 |
| 6,240,328 | B1 | 5/2001 | LaLonde et al. | 700/95 |
| 6,300,948 | B1 * | 10/2001 | Geller et al. | 715/866 |
| 6,324,534 | B1 * | 11/2001 | Neal et al. | 1/1 |
| 6,487,713 | B1 * | 11/2002 | Cohen et al. | 717/105 |
| 6,810,401 | B1 * | 10/2004 | Thompson et al. | 1/1 |
| 6,871,198 | B2 * | 3/2005 | Neal et al. | 1/1 |
| 2002/0073001 | A1 * | 6/2002 | Palmer et al. | 705/29 |
| 2002/0124055 | A1 * | 9/2002 | Reisman | 709/218 |
| 2002/0143653 | A1 * | 10/2002 | DiLena et al. | 705/26 |
| 2002/0165701 | A1 * | 11/2002 | Lichtenberg et al. | 703/7 |
| 2002/0188622 | A1 * | 12/2002 | Wallen et al. | 707/104.1 |
| 2003/0046179 | A1 * | 3/2003 | Anabtawi et al. | 705/26 |
| 2003/0074164 | A1 * | 4/2003 | Simmons et al. | 703/1 |
| 2003/0095141 | A1 * | 5/2003 | Shah et al. | 345/735 |
| 2003/0115115 | A1 * | 6/2003 | Ouchi | 705/27 |
| 2003/0236707 | A1 * | 12/2003 | Cheney | 705/26 |
| 2004/0045001 | A1 * | 3/2004 | Bryant | 718/100 |

OTHER PUBLICATIONS

Yu et al. "A Configuration Tool to Increase Product Competitiveness", IEEE 1998.*

Hedin et al. "Product Configuration Using Object Oriented Grammars", ECOOP 98, SCM-8, LNCS 1439, pp. 107-126, 1998.*

Myung et al. "Knowledge-Based Parametric Design of Mechanical Products based on Configuration Design Method", Expert Systems with Applications 21 (2001) 99-107.*

Oh et al. "Mapping product structures between CAD and PDM systems using UML", Computer-Aided Design 33 (2001) 521±529.*

Hvam et al. "A procedure for building product models", 2000.*

Fohn et al. "Configuring computer systems through constraint-based modeling and interactive constraint satisfaction", Computers in Industry 27 (1995) 3-21.*

Sivard, Gunilla. A Generic Information Platform for Product Families, 2001.*

Wolfe et al. "Electronic Commerce for the Fluid Power Industry: Production Configuration, CAD Drawing Generation, in Real-Time, On-Line", International Fluid Power Expo. Technical Conference IFPE-2000-Chicago.*

* cited by examiner

PRODUCT CONFIGURATION METHOD AND SYSTEM

CROSS REFERENCE TO RELATED APPLICATIONS

This application claims the benefit of U.S. Provisional Patent Application Ser. No. 60/325,005 filed Sep. 25, 2001, the entire contents of which are incorporated herein by reference.

FIELD OF THE INVENTION

The present invention relates generally to a product configuration system, and more particularly, to an object oriented product configuration system comprised of a model tool for modeling a product and a runtime tool for configuring a product.

BACKGROUND OF THE INVENTION

Manufacturers often provide customers with numerous choices regarding features and attributes of products, thereby providing the customer with a greater flexibility when ordering products to meet their individual needs. The specific combination of product attributes, as selected by the customer, is typically referred to as the "product configuration", hereafter simply referred to as the "configuration". As the number of choices given to the customer increases, so does the complexity surrounding the configuration. The selection of a particular attribute may require or forbid the selection of other attributes. For example, when ordering a configurable bicycle a customer may select a mountain biking package. The selection of that package may mandate the selection of a particular heavy duty suspension system, while simultaneously prohibiting the selection of a particular street suspension system. The guidelines that govern the selection of the configuration are collectively referred to as "rules". The difficulty in managing the selections, rules and other information associated with a particular configuration can become quite overwhelming. Thus, the need for a product configuration system, commonly referred to as a "configurator", to automate the process.

The product configuration system should also utilize a "meaningful model number", that is, a model number where each character is related to a particular attribute of the product. Examples of the types of attributes that may be represented by model number characters include: an option package, a part dimension, a product color, etc. Identical configurations, therefore, will share a common meaningful model number. Though prior art product configuration systems are known to utilize meaningful model numbers, there is still room for improvement.

For instance, one area of improvement involves the degree of automation. Some prior art product configuration systems are partially automated, such that certain portions of the configuration process are automated and others are not. Each portion of the configuration process that must be manually executed provides an opportunity for human error. Thus, it would be advantageous to increase the degree of automation for such a system. For example, a customer making product selections via the company's website, could use a highly automated product configuration system to immediately determine if a particular product configuration was available, what materials are needed, how much the configuration costs, and pass the order directly from the customer to the manufacturing site.

Another area of improvement involves the issue of compatibility. It is desirable that a product configuration system be flexible and compatible such that it may interact with a variety of systems. For example, a company may employ various software applications, such as software for generating a bill of material or for placing orders over the Internet, and the product configuration system should be compatible with all of them.

Moreover, there is the issue of complexity. Traditionally, product configuration system utilized overwhelming amounts of "logic code" in order to accomplish the tasks required of them. This resulted in a system where the logic, typically in the form of endless if-then type statements, and the data, usually constituting gigantic databases and look-up tables, were two separate entities. Each of these entities was very difficult and time consuming to manage. In contrast, "object-oriented" product configuration systems are organized as a collection of sub-objects, wherein the logic and data are one. Systems of this type also allow for the shared use of logic and data, such that a single product configuration system could provide information to a whole host of different applications. In the past, separate product configuration systems would need to be developed for each application requesting information.

Therefore, it would be advantageous to provide an improved product configuration system that utilized a meaningful model number, was fully automated, was compatible with numerous types of software applications, and was object-oriented such that it reduced the complexity of the system by making shared use of the logic and data.

SUMMARY OF THE INVENTION

The above-noted shortcomings of prior art project configuration systems are overcome by the present invention which provides a method and apparatus for configuring a product. The method of the present invention includes the step of providing a software tool that is capable of creating an electronic object-oriented product model representative of a product line, and the step of providing a software tool capable of making the information stored in the product model available to one or more software applications. Preferably, the product model includes an electronic profile model representative of a product within the product line, the profile model includes one or more electronic part models representative of a part within the product, and the part model includes one or more electronic quality models representative of an attribute of the part.

Objects, features and advantages of this invention include, but are not limited to, providing a method and apparatus for configuring a product where the invention is of relatively simple design, economical development and has a long and useful life in service.

BRIEF DESCRIPTION OF THE DRAWINGS

The advantages and features of the product configuration system of the present invention will be readily apparent with reference to the appended description, claims and drawings, wherein:

DETAILED DESCRIPTION OF THE PREFERRED EMBODIMENT

Prior Art

Figure 1:
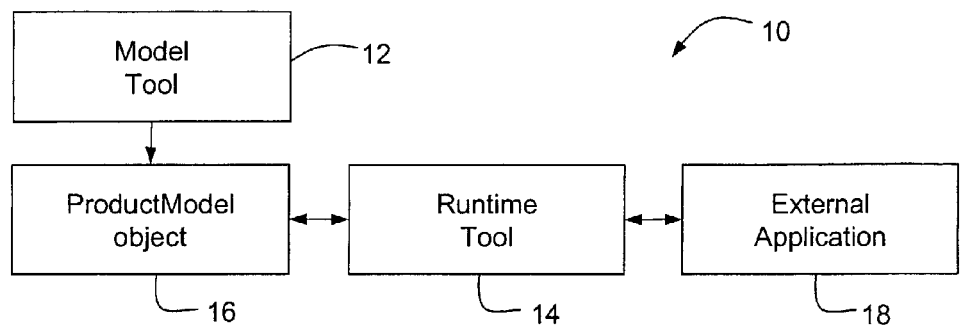
FIG. 1 is a block diagram showing an overview of a preferred embodiment of the product configuration system of the present invention.

Various types of product configuration systems have been widely used in manufacturing and other industries. Currently, there are five general types of product configuration systems available, which are referred to as Generations 1-5. Generation 1, is a simple option selection configuration system; that is, Generation 1 systems simply provide a user with a selection between one or more options. For example, a user configuring a bicycle with a Generation 1 system may be asked to choose between a "red, green, or white frame". A Generation 1 system does not take additional considerations into account, such as the fact that certain color frames may be prohibited from being installed on bicycles with certain color wheels. This type of product configuration system works well if the choices available are relatively few and are not interdependent.

Generation 2 product configuration systems are similar to those of Generation 1, however, they also include a set of rules or interdependencies that either allow or prohibit certain choices based on selections already made. Generation 2 systems resemble what is commonly known as an "expert system". The following are examples of rules that could be utilized by a Generation 2 system, "If a red frame is selected, then only red, white, or chrome wheels can be selected," or "If a green frame is selected, then red wheels cannot be selected." The use of rules constitutes an important advancement over Generation 1 systems, but depending on the complexity of the product, these rules can easily become lengthy and very difficult to maintain.

Though it is possible for a Generation 1 or 2 product configuration system to utilize a meaningful model number, that is, a model number where each character pertains to an attribute of a product line, an additional challenge involves producing an accurate bill of materials (BOM). This challenge is addressed by Generation 3 product configuration systems, often referred to as Matrix-based systems. A Generation 3 system still utilizes option selection and rules, as seen in the previous two generations, but also uses spreadsheet-style arrays or matrices filled with information pertaining to the numerous constituent parts of that product line. Database lookup keys, which are used for locating information in a database, allow for the selection of individual constituent part. Accordingly, Generation 3 systems are capable of extracting or parsing out specific portions of a model number and using those portions as database lookup keys to locate corresponding information; as opposed to simply using rules to govern which options can and cannot be selected. The system can then use the database information to compile a BOM, an ability that the previous generation systems did not have. It should be noted, numerous types of data structures, including databases, matrices, arrays, spreadsheets, etc., could be used to store the information pertaining to a particular product line.

Generation 4 product configuration systems, often referred to as Part Intelligent/Rules based systems, incorporate many of the features of the previous generation systems and also refer to additional data not previously accounted for. These systems recognize the fact that generating an accurate BOM cannot always be accomplished by simply utilizing portions of a model number. There are some instances when additional information and data is required. For instance, if a user is configuring a certain product and the configuration system is attempting to generate a BOM, the correct choice for a particular bolt may be based on information not directly contained in the model number, such as the diameter of the tube through which the bolt extends. In this case, a lookup table pertaining to tube diameters, in addition to those pertaining to the model number for that particular product line, would be needed to generate an accurate BOM. In this sense, Generation 4 systems are robust enough to go beyond the model number and acquire whatever additional information is needed. Though product configuration systems such as these address many of the needs in the area, the sheer size and complexity of the accompanying data structures and logic is often overwhelming. Also, systems of these types must often be coupled to an enterprise resource planning (ERP) system which contains much of the information. Maintaining accurate data and logic can be a daunting task, particularly when a single product line can have component permutations extending well into the millions.

The latest generation product configuration system, Generation 5, is an object-oriented system. Object-oriented systems utilize a completely different approach to configuring a product than the traditional systems used in the previous generations. Object-oriented systems break down a product line into constituent components, which may in turn be further broken down into more elemental components, etc. Additionally, each component may be broken down into its various attributes. In this sense, each component is independently "modeled", that is, all of the pertinent information needed to describe that component is stored in a hierarchy of objects within the system. There are numerous benefits from a structure such as this. First, the logic that drives the system and the product specific data are simplified because they are stored as one; rather than having independent logic code that pulls information from an independent data source. Second, once a product line is accurately modeled, certain things, like model numbers and BOMs, actually become predetermined. Thus, the emphasis has shifted away from maintaining complex matrices, lookup tables, databases, and other data structures that are accessible only under the direction of intricate case logic based rules. The emphasis is now placed on accurately modeling or defining a product based upon its constituent components and attributes. Third, object-oriented systems can be designed to be stand alone, that is, they are not application specific by being bundled within a larger system, such as an ERP. Accordingly, a single object-oriented system can provide information to numerous external applications. These are just a few of the advantages associated with using a system having an object-oriented structure. The description now turns to the product configuration system of the present invention.

Present Invention

The present invention relates to an object-oriented product configuration system 10. Generally, the configuration system 10 is designed to accomplish two primary tasks: 1) to provide a tool for modeling a particular product line, and 2) to provide a tool for accessing and presenting the information of that modeled product line. The first task is accomplished by a component of the configuration system 10 referred to as a model tool 12, and the second task is accomplished by a component of the configuration system referred to as a runtime tool 14. In short, model tool 12 provides a user, referred to as a "modeler", with the interface and tools necessary to create a ProductModel object 16, which is an electronic file containing all of the information about a particular product line. The runtime tool 14 provides a user of an external application 18 with an interface and the tools necessary for accessing the information contained in the product model object 16, such that the information may be utilized in a meaningful way.

The product configuration system 10 is capable of being implemented in one of numerous scenarios. For instance, the entire configuration system 10 could be installed on a desktop without the use of a server. In which case, the requisite electronic files for both the model tool 12 and the runtime tool 14 would be stored on a single machine. Alternatively, the product configuration system 10 could be installed in a client/server arrangement, that is, certain electronic files used by either the model tool 12 or runtime tool 14 could be located on a server while other electronic files are located on a particular client machine. The product configuration system 10 of the present invention is very flexible, as it can be designed to be neither machine, platform, nor architecture specific, thereby being compatible to a whole host of external applications. The actual model tool 12, runtime tool 14, and ProductModel object 16 can be stored on any type of computer-readable medium, such as a hard drive, read/write memory (RAM), CD-ROMs, and DVDs, to name but just a few. It is worth noting, the computer utilized in connection with the present invention includes all standard internal and peripheral components known in the art, including a monitor, a keyboard, and a mouse.

With reference to FIG. 1, the object-oriented product configuration system 10 of the present invention generally includes two primary software components: a model tool 12 and a runtime tool 14. Generally speaking, model tool 12 is an executable software program that provides a modeler with the interface and tools required for modeling a particular product line. A particular product line is modeled by creating a ProductModel object 16, which is an electronic file containing various types of information, stored in the form of objects, on that product line. The runtime tool 14, which is an Application Programming Interface (API), acts as an intermediary by making the information of the ProductModel object available to numerous types of external applications 18. A significant advantage of this system is that information on a particular product line is contained in a single source, yet is available to numerous applications. Consequently, the upkeep, maintenance, and deployment of that information is greatly simplified.

The model tool 12 and runtime tool 14 of the present invention may be designed according to one of numerous methods and still be capable of creating and accessing the ProductModel object 16, respectively. Thus, the following description will primarily focus on the structure of the ProductModel object 16, instead of a particular implementation of the model tool 12 or runtime tool 14.

Model Tool

The model tool 12 is an executable software program that provides a modeler with a Graphical User Interface (GUI) and the tools required to create a ProductModel object 16. Preferably, the model tool 12 is written in an object-oriented language, such as JAVA or C++, however, other programming languages could be used. The model tool GUI includes a collection of various window editors, each one of which allows the modeler to input information on a particular aspect of the product line being modeled. For instance, one of the window editors allows a modeler to name the particular ProductModel object 16 being created, while another one of the window editors allows the modeler to design a model numbering scheme for the product line. The model tool 12 also performs numerous types of additional functions, such as creating appropriate subdirectories, files, and anything else that may be needed. All of this information is stored in the form of electronic files, referred to as objects, which collectively form the larger ProductModel object 16. In this sense, model tool 12 provides a modeler with the ability to define all of the attributes of a particular product line by creating a ProductModel object 16, which will now be discussed.

ProductModel Object

Figure 2:
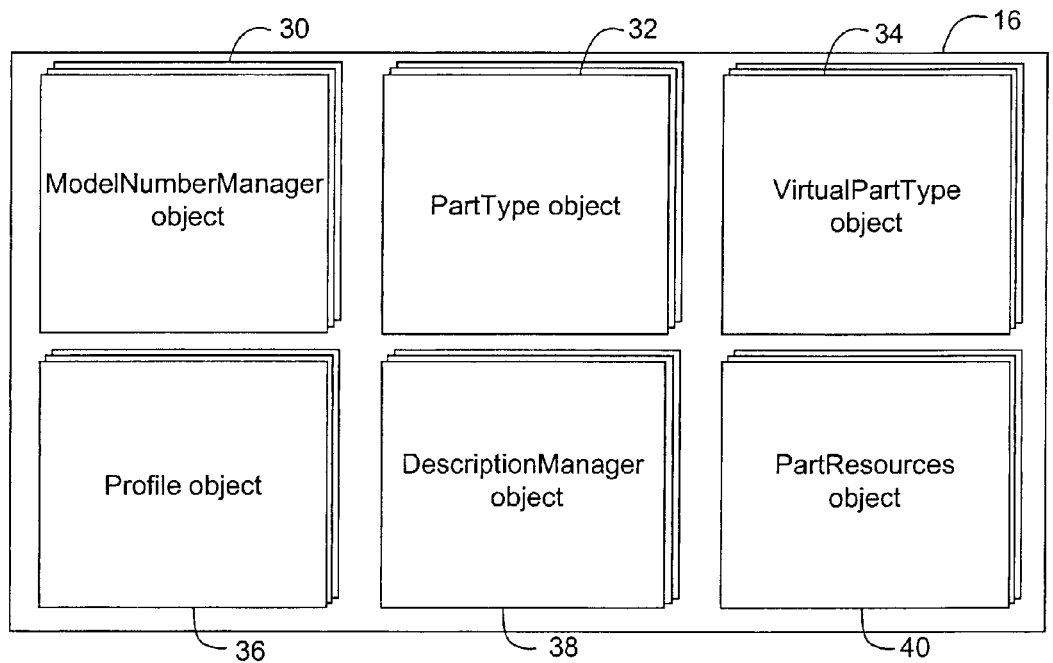
FIG. 2 is a block diagram showing an overview of a preferred embodiment of the product model object shown in FIG. 1.

Referring now to FIG. 2, there is seen a particular embodiment of a ProductModel object 16 which is both an object itself and a collection of smaller sub-objects. The particular sub-objects included within the ProductModel object of this embodiment include: one or more ModelNumberManager objects 30, one or more PartType objects 32, one or more VirtualPartType objects 34, one or more Profile objects 36, one or more DescriptionManager objects 38 and one or more PartResources objects 40. The ProductModel object, which is stored in the form of an electronic file, pertains to an overall product line and the smaller constituent sub-objects pertain to specific aspects of that product line. One of these sub-objects could include information on a specific sub-component or sub-assembly of the product line. For example, a modeler could create an overall ProductModel object 16 for a bicycle product line that includes a collection of smaller sub-objects. One of those sub-objects could include information specifically directed to the bicycle frame, while another sub-object contained information directed to the bicycle forks, the wheels, and so on. Furthermore, each of these sub-objects may be a collection of yet smaller sub-sub-objects. The sub-object containing information about the wheel could be further broken down into a collection of sub-sub-objects containing information about the tire, the tube, the spokes, etc. This continues until the point where the modeler no longer wishes to describe a component in terms of smaller sub-components. Each object, sub-object, or even sub-sub-object could themselves include a collection of objects, each of which pertains to a specific attribute or aspect of the larger object. For instance, the object pertaining to the spokes mentioned above may include sub-objects that: define the spoke's part numbering scheme, provide dimensions, provide materials, etc. Therefore, a ProductModel object 16 models a product line by including sub-objects pertaining to sub-components, sub-objects pertaining to particular attributes, sub-objects pertaining to other aspects of the product line, such as the model numbering scheme, as well as all of objects' various interdependencies. Once the model tool 12 is used to create a ProductModel object it is in what is referred to as an initial state. The initial state is a rough template that defines all of the possible variations of a product line, but does not contain a specific product configuration, known as an "established state". This modeled information is then compiled and made available to the API, or runtime tool 14, which create a specific product configuration. Thus, the runtime tool 14 creates a specific configuration by selecting from the available variations defined in the initial state ProductModel object. Discussion of the ProductModel object begins with the ModelNumberManager object 30.

Figure 3:
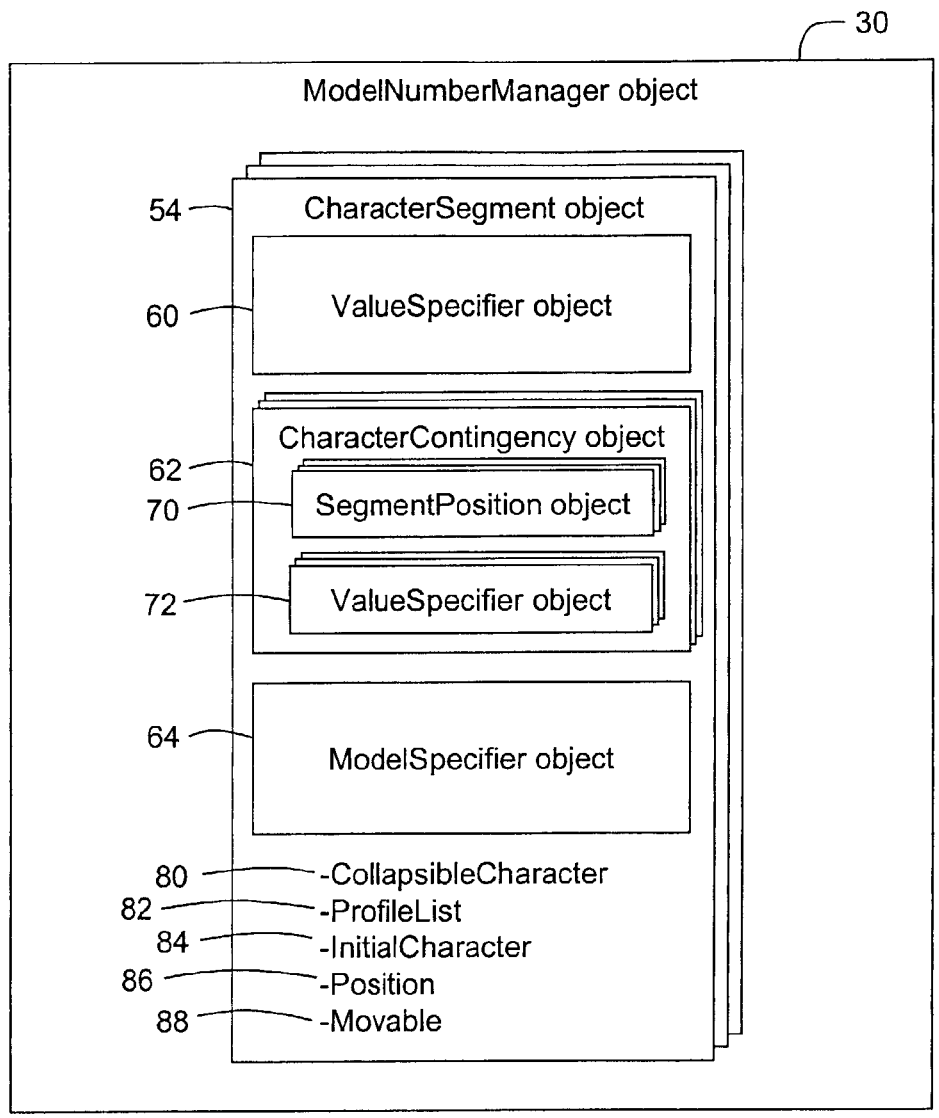
FIG. 3 is a block diagram showing a preferred embodiment of a ModelNumberManager object shown in FIG. 2.

FIG. 3 shows an example of the ModelNumberManager object 30, which is an input-type "perspective", in greater detail. Generally, a perspective is an object that controls the exchange of information between a user and the ProductModel object 16, as different users are concerned with different aspects of the product line. For example, users entering purchase orders may want to know whether or not a particular model number is valid, while users involved in product sales may be concerned with the price of the product, and yet still, users involved in engineering may want to review the dimensions of specific components. All of these users are concerned with the same product, however, they are each seeking different types of information. Perspectives take this into account by controlling the exchange of information to and from a ProductModel object 16. The ModelNumberManager object is but one example of a perspective type object.

Figure 4:
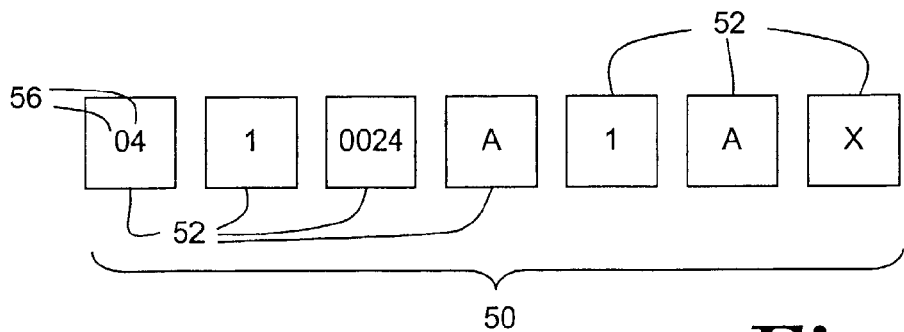
FIG. 4 shows a preferred embodiment of a model number used in conjunction with the ModelNumberManager object shown in FIG. 3.

Referring now to FIGS. 3 and 4, the ModelNumberManager object 30 defines a model numbering scheme for the product line represented by the ProductModel object 16. The model numbering scheme defines the set of rules and links to information that makes a model number meaningful. That is, a model number 50 is broken into one or more character segments 52, the contents and position of which specifically relate to a particular attribute of the product line. Traditionally, configuration systems considered each character, referred to as a "model number position" ($1^{st}$ position, $2^{nd}$ position, etc.), separately. The configuration system of the present invention, however, is capable of grouping multiple characters 56 into a single character segment 52, and treating each character segment 52 separately. A meaningful numbering scheme is advantageous as it is capable of efficiently handling both catalog products, which already have a specific model number, and made-to-order products, whose product number is yet to be determined. For example, a model numbering scheme pertaining to a bicycle may include a first character segment that identifies the particular product series of that bicycle product line. The second character segment may indicate whether the bicycle is for a man or a woman. The third character segment may correspond to the size of the frame, and so on. Accordingly, a meaningful numbering scheme allows a product to be described by its model number. The product configuration system 10 of the present invention uses an algorithm, as opposed to a database lookup, to inspect the product model number, as will be explained. Furthermore, each character segment 52 has a corresponding CharacterSegment object 54, as seen in FIG. 3. The ModelNumberManager object will likely include numerous CharacterSegment objects, however they all have identical structures, thus, only a single CharacterSegment object 54 will be described.

Each CharacterSegment object 54 pertains to a single character segment 52, which in turn may contain one or more characters 56. The CharacterSegment object 54 shown in FIG. 3 includes a ValueSpecifier object 60, one or more CharacterContingency objects 62, a ModelSpecifier object 64, and several information fields and flags. A flag is simply a Boolean value that returns either a "true" or a "false" value. The ValueSpecifier object 60 determines which characters will and won't be allowed in that character segment; this is referred to as "vertical validation". The ValueSpecifier object 60 is a Boolean-type specifier that returns a true or false value depending if the characters 56 are appropriate for that character segment 52. For instance, if the first character segment 52 is supposed to be a two digit number ranging from 00-99, ValueSpecifier object 60 would return a false value if the characters "AA" were located in that character segment. Several different categories of Boolean-type specifiers are available, these include: an EqualitySpecifier, a RangeSpecifier, an InclusiveSpecifier, an ExclusiveSpecifier, an AlphabeticSpecifier, a NumericSpecifier, an AlphaNumericSpecifier, and an InvalidSpecifier. In order for any of these Boolean-type specifiers to be utilized, they must be provided with a string such that they can test it.

The EqualitySpecifier contains some information fields that the modeler must define; these include an EqualityValue and a ComparisonFunction. The EqualityValue is the value against which the submitted string is compared. The ComparisonFunction is the particular function used to compare the EqualityValue to the submitted string, and can include the following functions: $=, <, >, \leq, \geq$. Strings can easily be compared to each other by using ASCII values, as is well known in the art. The RangeSpecifier requires the modeler to define minimum and maximum fields. Thus, the RangeSpecifier will return a true value if the numeric or ASCII value of a submitted string falls between these two modeler-defined limits. Furthermore, the RangeSpecifier can include a NumberOnly flag, which is used to test multi-character number strings. For example, if the NumberOnly flag was set to true, 01=1, 001=1, 0001=1, and so on. Where if the NumberOnly flag was set to false, 01 would be treated as two separate characters (as both a 0 and a 1). The InclusiveSpecifier requires the modeler to define a list of values that if entered, the InclusiveSpecifier will return a true value. Thus, a submitted string is compared against this list to determine whether or not it is on the list. Conversely, the ExclusiveSpecifier requires the modeler to enter a list of values that if the submitted string is not on, the ExclusiveSpecifier will return a true value. The AlphabeticSpecifier does not require a modeler to enter any information, as it examines a submitted string and return a true value if the ASCII value of that string falls within the range of alphabetic ASCII characters. Similarly, the NumericSpecifier requires no information from the modeler and returns a true value if the ASCII value of a submitted string falls within a range dedicated to numeric values. Likewise, the AlphaNumericSpecifier will return a true value if a submitted string falls within either the alphabetic or numeric range of ASCII values. The InvalidSpecifier returns a false value no matter what string is submitted, and is used to purposely cause a character segment to be found invalid. The InvalidSpecifier is used in conjunction with error messages and will be subsequently described in more detail. It should be noted, the Boolean-type specifiers just discussed may be used throughout the product model object 16, and are not limited to the character segment object 54. Moreover, the preceding list is not exclusive.

The CharacterContingency object 62 is also a Boolean-type specifier and generally includes one or more matched pairs; each pair includes a SegmentPosition object 70 and a ValueSpecifier object 72. The CharacterContingency object 62 is used to define rules for preventing invalid model number combinations. This set of rules is often referred to as a character segment validation sequence, and the process is referred to as "horizontal validation". The CharacterContingency object returns a value of either true or false, which indicates if the particular product configuration, as represented by the submitted model number, is allowable. For example, in the case of a horizontal validation sequence for a bicycle model number, certain combinations of features may not be valid. If a user configuring a bicycle selects a mountain bike package, represented by the third character segment, for instance, and also selects a pair of street tires, represented by the fifth character segment, an error message should alert the user that such a model number combination is invalid. This is true even though each of those character segments are independently valid; that is, they are valid under vertical validation but not horizontal validation. It is the combination of those two segments that is invalid. The SegmentPosition object 70 identifies the other character segment against which the present character segment (the one that CharacterSegment object 54 pertains to) is to be compared, and the ValueSpecifier object 72 contains the comparison criteria. The ValueSpecifier object 72 may be one of the Boolean-type specifiers previously explained, or may be of a different category. Thus, two or more character segments 52 are compared and if that particular combination is allowed the CharacterContingency object 62 returns a true value, and if it is not allowed a false value is returned. It is worth noting, that even though a comparison involves two or more character segments 52, only one of the corresponding CharacterSegment objects 54 needs to include a CharacterContingency object 62 for making that comparison. For once the comparison is made, it is not necessary to make it again.

The ModelSpecifier object 64 contains a link that establishes the relationship between the character segment 52 in question and its corresponding attribute stored in the ProductModel object 16. More specifically, the ModelSpecifier object 64 is a link-type specifier that contains the necessary information for connecting the CharacterSegment object 54 to a PartType or a VirtualPartType object, which have not yet been described. In this sense, the ModelSpecifier object may act as either an input or an output. In the input sense, the ModelSpecifier can extract specific information from another object and use this information to derive a value for the corresponding character segment 52. This is the case where a product has already been configured and the ModelNumberManager is being used to derive a model number. In the output sense, if a specific model number is provided during the configuration process, the ModelSpecifier can output the value of the character segment 52 provided by the user to another object, such that the receiving object populates itself with that value. This occurs during the configuration process where a known model number is being used to configure a product. The links provided by the ModelSpecifier object 64 allow the configuration system 10 of the present invention to know which attribute is associated with which character segment 52, thereby allowing for utilization of the meaningful model number.

Additionally, each CharacterSegment object 54 includes a CollapsibleCharacter flag 80, a ProfileList string 82, an InitialCharacter value 84, a Position value 86, and a Moveable flag 88. The CollapsibleCharacter flag 80 contains a value indicating whether the model numbering scheme is to treat a combination of options according to a first or a second method. For example, suppose a bicycle has three available options, represented as follows: LS=leather seat, WR=wheel reflectors, and SE=seat extension, and that option selections are represented at the end of the model number (S-10XX, where "XX" is the option designation). If the CollapsibleCharacter flag 80 is set to true, thus indicating a "collapsing number", then the number of characters 56 within a particular character segment 52 is fixed. Accordingly, combination codes must be employed to accommodate for the selection of more than one option. For instance, LL=LS+WR, such that a selection of both leather seats and wheel reflectors would result in a model number reading S-10LL. If the CollapsibleCharacter flag 80 is set to false, thus indicating a "non-collapsing number", then additional option codes are simply appended to the preceding option code. For example, the selection of both leather seats and wheel reflectors would result in a model number reading S-10LSWR. The ProfileList string 82 is a list of the Profile objects, which have not yet been explained, that may use this particular model numbering scheme. The InitialCharacter value 84 contains a value indicating the number of characters 56 that should be included in the character segment 52 in question. Thus, if the initial character value was set to 3, the system would know that this character segment is a three-digit segment. The Position value 86 indicates the position of the character segment 52 in the overall model number 50. Thus, if a first CharacterSegment object 54 includes a Position value 86 set to 1 and an InitialCharacter value 84 set to 2, and a second CharacterSegment object 54 included a Position value 86 set to 2 and an InitialCharacter value 84 set to 1, the system would know that the first character segment 52 is two characters long and the second character segment is one character long. The Moveable flag 88 contains a true of false value that determines if this character segment 52 may be moved to a different position or if it may be omitted from the model number 50. It should be noted, even though the information just discussed was in the form of flags, values, and strings, that information could also be in the form of additional objects within the CharacterSegment object 54. As previously stated, a separate CharacterSegment object 54 is needed for each character segment 52 of the model number 50.

It should be noted, the particular order, number of characters per character segment, type of characters allowed, number of character segments in the model number, and other particulars of the examples discussed above and shown in the Figures are only intended for exemplary purposes, and are not limited to those embodiments. Following the establishment of the ModelNumberManager object 30, the modeler may create one or more PartType objects 32.

Figure 5:
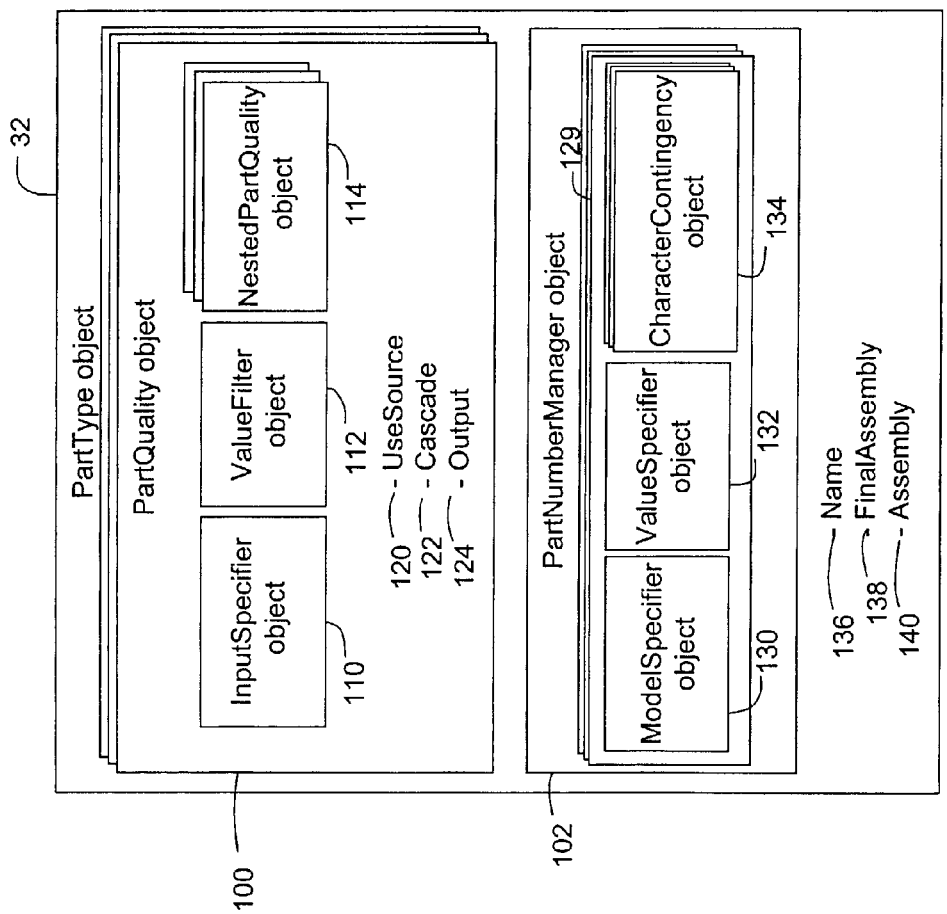
FIG. 5 is a block diagram showing a preferred embodiment of the PartType object shown in FIG. 2.

With reference to FIG. 5, there is seen an embodiment of a PartType object 32 which includes one or more PartQuality objects 100, a PartNumberManager 102, and several flags. The PartType object 32 is a generic template that is representative of a particular component; that component may be an elemental component that cannot be further broken down, or it may be a subassembly comprising a collection of smaller constituent components. Either way, the collection of all of the PartType objects 32 together represent a master list of parts that a modeler may select from when modeling a particular product. If a specific component is not represented by a PartType object 32, it cannot be subsequently used during the modeling process. In order to adequately describe a PartType object 32, a modeler may define numerous PartQuality objects 100, which contain information on specific attributes of that PartType object. Numerous categories of PartQuality objects 100 are available, including: a DescriptionQuality, a MergeQuality, a BooleanQuality, LogicalQuality, a NumericQuality, a CalculationQuality, a DimensionQuality, and a DiameterQuality, to name but a few. An object 100 of the DescriptionQuality category may contain any type of textual description of the quality associated with that PartQuality object 100. The MergeQuality category is capable of parsing out values from other PartQuality objects 100 and storing them as a combined single string. The BooleanQuality category is capable of storing a true or false value, similar to the flags previously discussed. An object 100 of the LogicalQuality category can store the result of a Boolean equation based upon other LogicalQuality or BooleanQuality category objects 100. Thus, a LogicQuality category can access other PartQuality objects 100 in order to return a value. The NumericQuality category only stores numbers. The CalculationQuality category can store the result of a mathematical function having variables, where the values of those variables are contained in other NumericQuality or CalculationQuality category objects. Finally, the DimensionQuality and DiameterQuality categories include information pertaining to spatial dimensions. Other categories of PartQuality objects 100 may exist; this is simply a list of those most commonly used. Now that the various categories of PartQuality objects 100 have been mentioned, we now turn to the sub-objects of a PartQuality object 100.

Each PartQuality object 100 corresponds to a particular attribute of the PartType object 32 being modeled, and may include an InputSpecifier object 110, a ValueFilter object 112, and one or more NestedPartQuality objects 114. When a PartType object 32 is first created, it is in a generic, or "initialized" state; that is, it does not have specific values for part qualities. However, each PartQuality object 100 is set up to subsequently receive specific information during the configuration process. That process of receiving and verifying information involves the InputSpecifier object 110 and the ValueFilter object 112. The InputSpecifier object contains a link or path that connects this particular PartQuality object 100 to some other object within the ProductModel object 16. That other object may be another PartQuality object within the same PartType object, or it may be contained within a separate object altogether, such as the ModelNumberManager object 30. This linking allows for a chain reaction, or automatic flow of information, when specific values are eventually entered during the configuration process. For example, in the bicycle scenario previously discussed, assume there is a first PartType object 32 for a wheel spoke, and that PartType object includes a first PartQuality object 100 (of the DimensionQuality category) pertaining to the length of the spoke. Further assume the first PartQuality object includes an InputSpecifier object 110 linking the spoke length to a second PartQuality object (of the DiameterQuality category) contained in a second PartType object for a wheel assembly. If a user during the configuration process enters a specific value for the wheel diameter, that could automatically populate the spoke length with a specific, corresponding value. This interlinking structure provides for quick and accurate configuration of a product by utilizing shared data whenever possible. The example just provided describes an InputSpecifier object 110 that links two PartQuality objects 100 together, however, the InputSpecifier could just as easily link other types of objects together. For instance, if InputSpecifier 110 contained a link connecting that PartQuality object 100 to a CharacterSegment object 54, and a user entered a specific model number during configuration, then the specific character corresponding to the CharacterSegment object in question could be used to automatically populate the PartQuality object with a specific value. Occasionally, the value automatically obtained through this linked network is not useful for the PartQuality object 100 making the request. In this case, the PartQuality object utilizes the ValueFilter object 112 to obtain a useful value.

The ValueFilter object 112 manipulates a particular value into a form more meaningful to the requesting PartQuality object 100. For instance, in the preceding example if the PartQuality object 100 for the wheels was of a textual based DescriptionQuality category, instead of a value based DiameterQuality category, then during configuration the user may enter a qualitative value, such as "large", instead of a quantitative value for the wheel diameter. The size "large" is not meaningful to the PartQuality object 100 pertaining to the spoke length, which is linked to the wheel diameter via the InputSpecifier object and is looking for a numeric diameter. Thus, the ValueFilter object 112 would convert "large" into an actual spoke length, such as 12", which could then be accepted by the spoke length PartQuality object 100. Therefore, the ValueFilter object 112 perpetuates the automatic flow of values during configuration, even when those values are of differing types. It should be noted, InputSpecifier and ValueFilter objects can also be used to automatically provide information, in addition to automatically receiving information as previously discussed. For example, assume that the wheel diameter PartQuality object previously described is linked to a second PartQuality object pertaining to the size of the brakes. During configuration, the InputSpecifier object for the wheels could automatically output a diameter value to the InputSpecifier object for the brakes, which in turn could use that information to determine the appropriate brake size to be entered into a brake size PartQuality object. In this scenario, the PartQuality object for the wheel diameter, which was previously receiving information from a CharacterSegment object 54, is now acting as a data source by providing information to the PartQuality object for the brakes.

It is worth noting, the ValueFilter object 112 is a conversion-type specifier, which means that it is used to convert one value into another value. There are numerous categories of conversion-type specifiers, these include: MappingSpecifiers, FileMappingSpecifiers, TableSpecifiers, ConditionalTableSpecifiers, and FractionalSpecifiers, to name but a few. Briefly, the MappingSpecifier utilizes a one-to-one mapping of values, which is commonly known in the art, to assign a converted value to each entered value. This map is created by the modeler and may include a DefaultAware flag. If the DefaultAware flag is set and an entered value is not accounted for in the map, then a default value is assigned instead of returning an error message. If the DefaultAware flag is not set and an unaccounted for value is entered, then an error message would be returned. The FileMappingSpecifier is identical to the MappingSpecifier, with the exception that the map is stored on the hard drive instead of in RAM. This is particularly helpful for mappings having a large number of entries. The TableSpecifier utilizes a table having X and Y axis in order to return the value located at their cross section. Thus, instead of requiring a single value, as did the previous Mapping and FileMapping type specifiers, this type of specifier requires two values. The ConditionalTableSpecifier type utilizes a list of TableSpecifiers, thus, the actual table plus two values (a total of three inputs) must be provided in order to return a specific value. The FractionalSpecifier type converts a fraction into a decimal, and vice-versa. These are only some of the conversion-type specifiers available, as others known in the art could also be employed.

Most categories of PartQuality objects 100 do not automatically include an InputSpecifier object 110, as this is an object typically added during the modeling process. The CalculationQuality, LogicalQuality, and MergeQuality category PartQuality objects, however, do have permanently installed InputSpecifier objects. These types of PartQuality objects 100 store a value pertaining to that quality which is directly derived from values store in other objects. Thus, it is necessary that PartQuality object have an InputSpecifier object 110 to link itself to the object where the pertinent information is maintained. Another distinction should be addressed; the difference between active and passive PartQuality objects 100. The PartQuality objects previously discussed each defined an InputSpecifier object 110 that contained a link to another object. This object is referred to as "active" because the values of these interlinked objects automatically populate during configuration. Accordingly, as specific values are entered during configuration, those values spread throughout the ProductModel object 16, populating otherwise blank objects with specific values whenever possible. Conversely, it is possible to have an InputSpecifier object 110 that is not linked to any other object. This is referred to as a "passive" PartQuality object because it requires a value to be manually entered during either the modeling or the configuration process. Because of the manual data entry, it is desirable for passive input specifiers to be Boolean-type, as previously discussed, to ensure that the values being entered are appropriate for that PartQuality object 100.

The example of the NestedPartQuality object 114 seen in FIG. 5 has the same structure as the PartQuality object 100 just described, but is nested within the larger, parent PartQuality object as a design convenience. The use of NestedPartQuality objects to associate auxiliary or transitory qualities within a larger, encompassing quality is optional. Because the structure and functionality of the NestedPartQuality objects 114 is the same as the non-nested PartQuality objects 100 just as described, further explanation has been omitted.

Furthermore, the PartQuality object 100 includes a UseSource flag 120, a Cascade flag 122, and an Output flag 124. UseSource 120 allows an object requesting information via a ValueFilter object 112 to determine whether they want to receive the original value, before it was altered by the ValueFilter object, or the converted value. If the UseSource flag is set, the original value sent by the object providing the information will be used; if it is not set, the converted value will be used. The Cascade flag 122 aids in automatically populating NestedPartQuality objects 114 with data. If this flag is set, then the value associated with this PartQuality object 100 will automatically be inserted into any NestedPartQuality objects 114 during configuration. This automatic data flow occurs, except where the NestedPartQuality object is of either the CalculationQuality, LogicalQuality, or MergeQuality categories having a fixed InputSpecifier object which links that NestedPartQuality object elsewhere. The Output flag 124 deals with which information will be presented to a user during configuration. If the Output flag is set, assuming the proper flags in the DescriptionManager object 38 (not yet discussed) are set, then the value for this PartQuality object 100 will be included in an output report provided to a user. Consequently, the modeler is able to determine which PartQuality objects will be available for selection to an output report.

The PartType object 32 may also include a PartNumberManager object 102, which is used to automatically derive a meaningful part number for the corresponding PartType object. This is an optional feature allowing for a part number to be derived. The PartNumberManager object 102 defines the numbering scheme for the part number and generally comprises one or more CharacterSegment objects 129 each having one or more ModelSpecifier objects 130, one or more ValueSpecifier objects 132, and one or more CharacterContingency objects 134, which are quite similar to the objects of the ModelNumberManager object having the same names. The ModelSpecifier object 130 links the CharacterSegment 129 to other objects, typically a PartQuality or VirtualPartQuality object, from which information can be obtained. This information is then converted by the ValueSpecifier object 132 into characters to be used in the part number. In this sense, the ValueSpecifier object 132 is acting not as a Boolean-type specifier, but more like a conversion-type specifier. Accordingly, all of the categories of conversion-type specifiers are available for use as a ValueSpecifier object 132. Each CharacterContingency object 134 is used to turn certain segments of the part number on and off, and to activate certain aspects of the part number logic as needed. In short, the PartNumberManager object 102 is created during the modeling process such that a mechanism is in place for generating a meaningful part number, even though an actual part number will not be assigned until the product is configured. If the modeler chooses to omit a PartNumberManager object, a part number must be manually inputted at a subsequent time. This manually inputted part number would then remain static for any configuration of the ProductModel object 16.

The PartType object 32 also includes a Name string 136, a FinalAssembly flag 138, and an Assembly flag 140. The Name string 136 is a string of characters that preferably contains a descriptive identifier for this PartType object 32. The FinalAssembly value 138 is a flag that indicates whether or not this particular PartType object is a final assembly, as will be subsequently explained. Similarly, the Assembly flag 140 is a Boolean value that indicates whether or not this PartType object 32 is an assembly of other PartType objects. Of course, the PartType object 32, as well as all other objects for that matter, could include additional fields, flags, variables, sub-objects, etc., or omit one of those shown here. The collection of PartType objects 32 acts as a master list of generic part templates, from which the modeler may select when modeling a product line. Likewise, the collection of VirtualPartType objects 34 acts as a master list, but instead of representing generic part templates it represents generic modifications.

Figure 6:
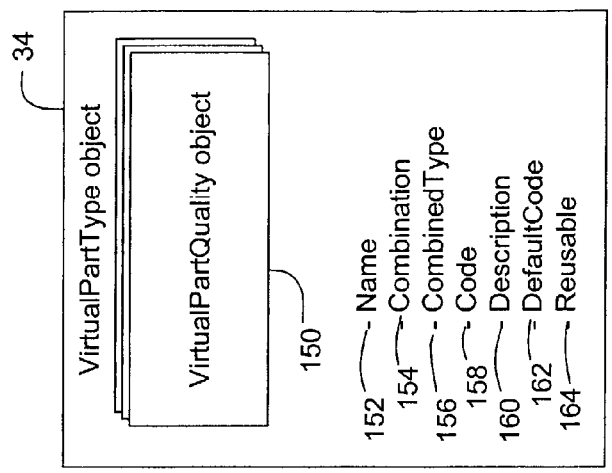
FIG. 6 is a block diagram showing a preferred embodiment of the VirtualPartType object shown in FIG. 2.

With reference to FIG. 6, there is seen an embodiment of a VirtualPartType object 34, which represents a generic, standardized modification for the product line being modeled. Stated differently, the VirtualPartType object is a template for an available modification, like an option or option package. The VirtualPartType object 34 shown here includes one or more VirtualPartQuality objects 150, each of which is identical in structure to the PartQuality object 100 previously described. Thus, a second description has been omitted. The VirtualPartType object 34 also includes a Name string 152, a Combination flag 154, a CombinedType string 156, a Code string 158, a Description string 160, and a EmptyCode string 162, and a Reusable flag 164. The Name string 152 is simply a text string indicating the name of this particular VirtualPartType object 34. The Combination flag 154 is similar to the Assembly flag 140, in that, it indicates if this option includes a combination of other options. For instance, referring back to the bicycle scenario presented earlier, a mountain biking option package may be available for that bicycle product line. However, the mountain biking package is not an actual part, thus, it is not represented as a PartType object 32. Rather, it is an option package that modifies certain PartType objects, hence, it is a VirtualPartType object 34. This package could include a collection of individual mountain biking options, such as knobby trail tires, additional shocks, a travel pack, etc.

Thus, the entire mountain biking option package would be a VirtualPartType object 34 with its Combination flag set to indicate that it is a collection of individual VirtualPartType objects. If the Combination flag 154 is set, the CombinedType string 156 indicates the name of the individual VirtualPart-Type objects that may be included within this combination. Preferably, a combination-type VirtualPartType object does not include another combination-type VirtualPartType object. Although not previously mentioned, the ModelSpecifier object 64 could link a CharacterSegment object 54 to a VirtualPartType object 34, just as it was able to link a CharacterSegment object 54 to a PartType object 32. It is through this ModelSpecifier object that options are selected and included within the meaningful model number. The Code string 158, Description string 160, and EmptyCode string 162 cannot be populated at this point, as they are not editable until a Profile object 36 is defined. Thus, a description of these variables will be provided later in the specification. In short, VirtualPartType objects 34 are not actual components, that is why they are not represented as PartType objects 32; rather, they are options that if selected, modify the attributes of actual components. Once all of the VirtualPartType objects 34 are created, the modeler is ready to create a Profile object 36.

Figure 7:
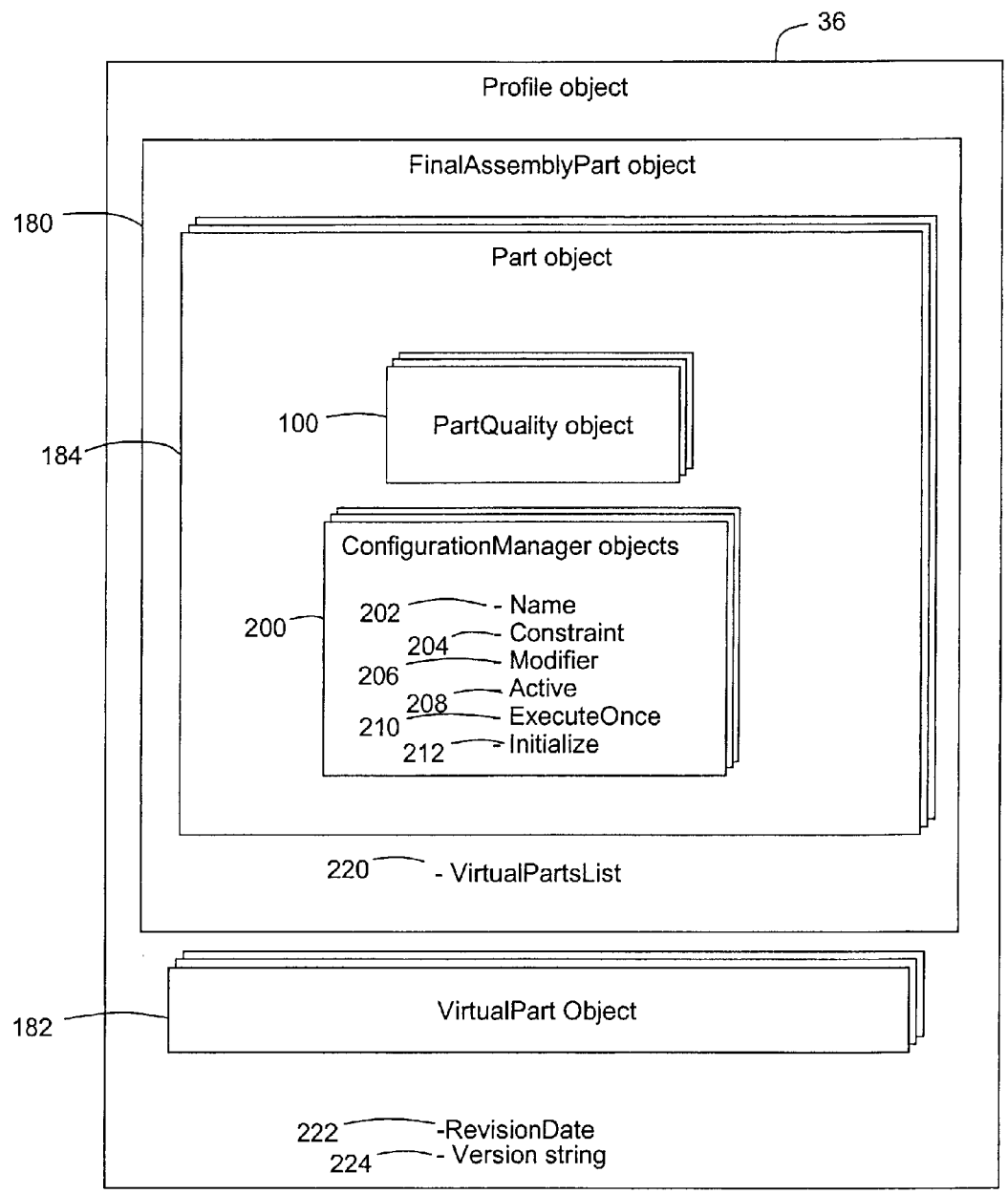
FIG. 7 is a block diagram showing a preferred embodiment of the Profile object shown in FIG. 2.

Referring to FIG. 7, an example of a Profile object 36 is seen comprising a FinalAssemblyPart object 180, one or more VirtualPart objects 182, and several information fields. While the ProductModel object 16 represents an overall product line, the Profile object 36 represents a particular product scenario within that product line. The product scenario, in turn, is representative of a particular product's structure and encompasses a variety of specific, allowable product configurations. Sometimes, if the different configurations available for a single product vary significantly, it warrants creating several Profile objects 36 for that single product; one for each of the main types of variations. For instance, if a particular bicycle product line has both a man's and woman's version that are only distinguished by slight differences, a single Profile object 36 could be created to sufficiently describe the structure of both variations. However, if the man's and woman's versions differed significantly in many different areas, it may be advantageous to have separate Profile objects 36 directed towards each version. To create a Profile object 36, the modeler begins by selecting from the collection of Part-Type objects 32 that have already been created. Preferably, the Profile object 36 is created such that parts are assembled in hierarchical order, beginning with an overall assembly and continuing down to smaller individual components.

Preferably, the modeler begins with a FinalAssemblyPart object 180, which is representative of the end product that is to be produced. To select a particular FinalAssemblyPart object 180, the modeler peruses only those PartType objects 32 which have been designated as final assemblies as indicated by their FinalAssembly flag 138. When a PartType object 32 designated as a final assembly has been selected and added to the Profile object 36, it becomes a FinalAssembly-Part object 180. Included within this FinalAssemblyPart object 180 are all of the PartQuality objects 100 and other information established when the PartType object 32 was initially created. Preferably, each Profile object 36 has only a single FinalAssemblyPart object 180, which in turn may be set up to include numerous Part objects 184. If the Assembly flag 140 of a PartType object 32 has been set, then that PartType object may include one or more sub-PartType objects when it is added to the Profile object. This sequence of adding PartType objects 32 continues until a PartType object is added which is not an assembly. When a PartType object 32 is selected and added to a Profile object, the added object is no longer a PartType object, it is now a Part object 184. A Part object 184 has all of the same elements as the PartType objects 32 previously discussed, as well as one or more optional ConfigurationManager objects 200.

The ConfigurationManager object 200 is optional and allows a user to select custom modifications not provided for in the PartType objects 32 or VirtualPartType objects 34. The Part object 184 may include one or more ConfigurationManagers 200, each of which comprises a Name string 202, a Constraint object 204, a Modifier object 206, an Active flag 208, an ExecuteOnce flag 210, and an Initialize flag 212. The Name string 202 simply identifies the particular ConfigurationManager object. The Constraint object 204 and Modifier object 206 act together as a sort of "if-then" statement. The Constraint object presents a constraint or condition, while the Modifier object presents a consequence if that condition is true. For example, a Constraint object could state, "if the bicycle frame is a "large" size", and the Modifier object could provide, "then add an extension tube to the seat assembly". Some common abilities of the Modifier objects 206 include being able to add a part, remove a part, add a part based on a desired quantity, set a value for a PartQuality object, and swap a part from a special part lookup table referred to as the PartResources, which will be subsequently described. The Active flag 208, if set, allows the ConfigurationManager object 200 to be deactivated or turned off. This is particularly useful when the modeler wants to temporarily disable the ConfigurationManager object, but does not want to delete it, such as during debugging. The ExecuteOnce flag 210, if set, only allows the ConfigurationManager object 200 to be executed only one time during the configuration process, thereby providing a single opportunity to make custom selections. This can be advantageous when the modeler wants to prevent a user from being able to make changes after a certain portion of the configuration process is complete. Lastly, if the Initialize flag 212 is set, then the ConfigurationManager object 200 will be executed before anything else during the configuration process. This is useful when any custom modifications that are going to occur need to be done first, such that they can be properly taken into account later. It is worth noting, the ConfigurationManager object 200 can only be used to customize Part objects that are identifiable when the Profile object 36 is established. That is, the modeler must specifically identify the Part objects eligible for modification when the modeler is creating the Profile object. A BatchConfigurationManager object (not shown), is substantially similar to the ConfigurationManager object. However, it allows a user to select the Part objects to be modified during configuration, thus providing even more flexibility for making modifications.

The VirtualPart object 182 supports options or standard modifications to the Profile object 36 and generally includes all of the elements previously discussed in connection with the VirtualPartType objects 34. As with the PartType and Part objects, once a VirtualPartType object 34 is added to a Profile object 36, it becomes a VirtualPart object 182. However, the original VirtualPartType object 34 that was selected remains in the collection of VirtualPartTypes for subsequent selections when creating other Profile objects 36. The same is true for PartType objects. During the modeling process, all VirtualPart objects 182 that the modeler makes available for subsequent selection are included in the overall Profile object 36. During the configuration process, those VirtualPart objects actually selected are listed in the VirtualPartList 220 located in the FinalAssemblyPart object 180. Furthermore, the Profile object 36 could include several VirtualPartLists, one for each VirtualPartType object 34 that was used as a template during the creation of the Profile object. For instance, if a VirtualPartType object 34 entitled "option" is used as a template to make a dozen different VirtualPart objects 182, each having a distinguishing Code string 158, then that "option" template would have its own VirtualPartList 220. During configuration, if a specific VirtualPart object 182 is selected, then its corresponding Code string 158 is added to the VirtualPart list 220.

The VirtuaPartType objects 34 previously created were generic templates, thus, additional information must now be provided. The Description string 160 contains a textual description of this particular VirtualPart object 182, and is now provided by the modeler. Numerous VirtualPart objects 182 can be created from a single VirtualPartType object 34 template, thus the need for a Code string 158 to differentiate between them. Each time a VirtualPartType object 34 is selected and added to a Profile object 36, the modeler must provide the newly created VirtualPart object 182 with a specific Code string 158. This Code string is used by the ModelSpecifier object 64 in the CharacterSegment object 54 such that the characters of the Code correspond to characters in the Model Number 50. The EmptyCode string 162 is a string that is returned by a combination type VirtualPart when the combination is empty. The Reusable flag 164 determines whether a VirtualPart object 182 that does not have its Combination flag 154 set, can be used in both a combination VirtualPart object and in a single VirtualPart object. If the Reusable flag is set, the non-combination VirtualPart object 182 becomes eligible to be a member of a separate VirtualPart object that does have its Combination flag set. Hence, the VirtualPart object being included in the combination is reused, instead of maintaining two duplicate VirtualPart objects: one for the single VirtualPart and one for the combination VirtualPart. As with the Part object 184, the VirtualPart object 182 may also include either a ConfigurationManager object or a BatchConfigurationManager object.

The Profile object 36 also includes a RevisionDate string 222 and a Version string 224. The RevisionDate string 222 contains a character string indicating the revision date of the particular Profile object 36 in question. Therefore, the modeler can copy a Profile object 36, change the RevisionDate string 222, and make changes to the Profile object without altering earlier versions of that Profile object. The product configuration system 10 of the present invention views all of the revisions as a single Profile object, that is, all of those stemming from a common ancestor. During the configuration process, the system chooses the version having the latest RevisionDate string, unless otherwise instructed by the user. The Version string simply identifies the version model tool 12 used to create this Profile.

Once the Profile object 36 is established, there now exists a model of a particular product scenario within the product line. Generally, this model defines all of the attributes, components, structures, numbering schemes, relationships, etc. that are required to sufficiently describe the product. Stated differently, the Profile represents a generic model of a specific product. The structure and particular components required for that product are specifically defined by the Profile, however, the individual values for the product are not added until the Configuration process. The next element of the ProductModel object 16 to be created is the DescriptionManager object 38.

Figure 8:
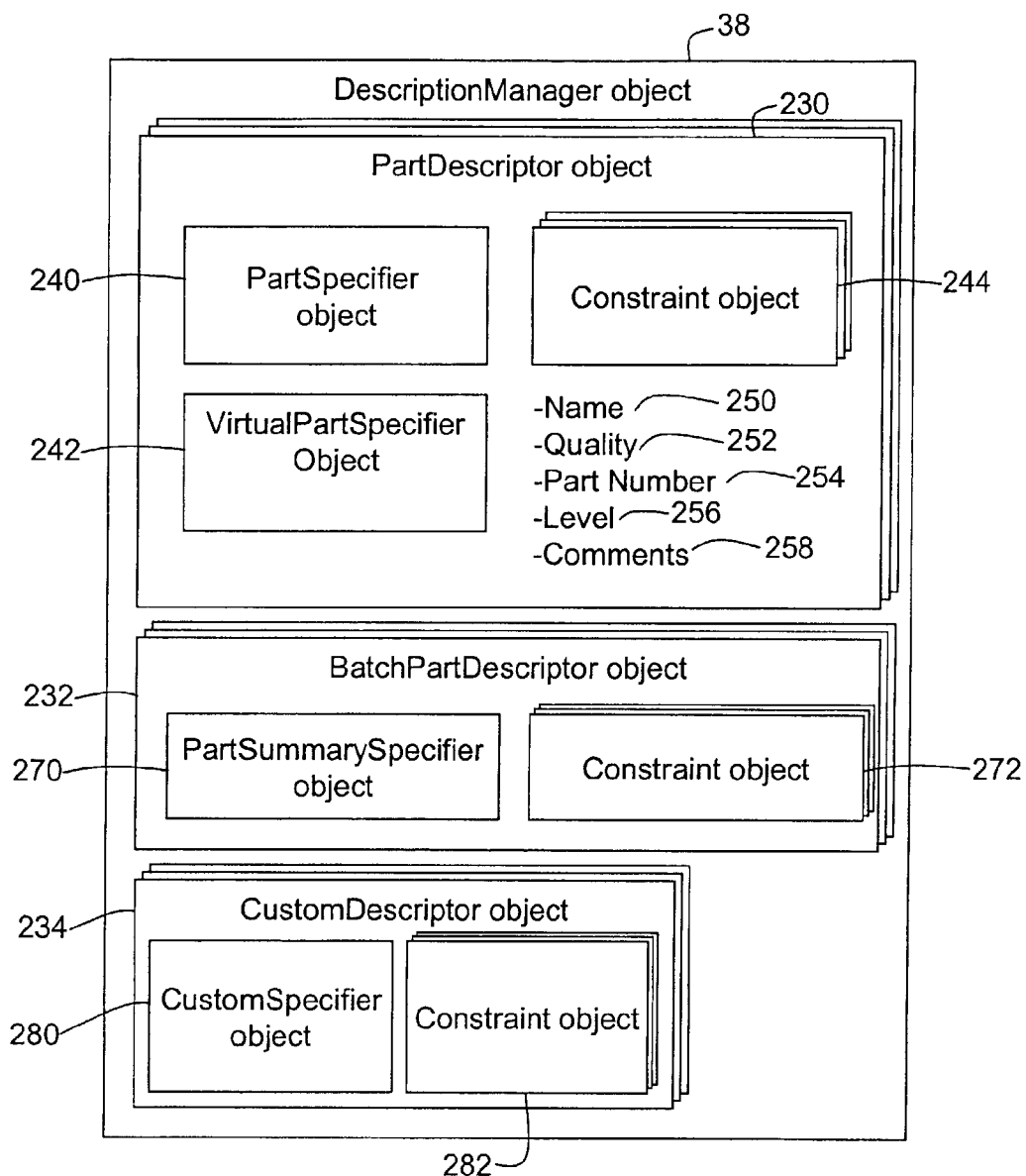
FIG. 8 is a block diagram showing a preferred embodiment of the DescriptionManager object shown in FIG. 2.

Referring now to FIG. 8, the DescriptionManager object 38 is a perspective-type object that determines what information will be extracted from the Profile object 36 and presented to an external application 18 during the configuration process. The particular embodiment of the DescriptionManager object 38 shown here pertains to a bill of materials (BOM), and includes one or more PartDescriptor objects 230, one or more BatchPartDescriptor objects 232, and one or more CustomDescriptor objects 234. Each PartDescriptor object 230 is designed to locate and extract specific information from the Profile object 36, and to present that information on a certain line of an output report. Generally, the PartDescriptor object includes a PartSpecifier object 240, a VirtualPartSpecifier object 242, and a Constraint object 244. Like other specifier-type objects previously discussed, the PartSpecifier object 242 contains a link which connects it to a specific PartQuality object 100 such that the DescriptionManager object 38 can access specific attributes when needed. Once this information is obtained by the PartDescriptor object 230, it must determine which information is to be outputted to the external application 18 requesting the information. This is where the Constraint object 244 comes into play. The Constraint object 244 essentially contains "if" type statements, similar to Constraint object 204, for determining which information will be provided, and is paired with a specific PartSpecifier object 240. If the "if" statement is true, then the information in the corresponding PartSpecifier object 240 is provided in a line of the output report; if the "if" statement is false, then the corresponding line is omitted from the output report. In this manner, the DescriptionManager object 38 can control which information is provided to which external application 18. For instance, if a user of a material purchasing application wants to know what the BOM for a particular product is, the user would call the DescriptionManager object for use with BOMs. That DescriptionManager object includes one or more PartDescriptor objects, each of which roughly represents a line of an output report. In turn, each PartDescriptor object includes one or more Constraint objects 244. For each line or entry of an output report, the corresponding Constraint objects 244 are evaluated. If true, the corresponding PartSpecificer object 240 (or VirtualPartSpecifier or BatchPartSpecifier objects for that matter) gathers the sought information, and the PartDescriptor object 230 outputs that information in the form of a line of an output report that reflects that information. If false, that line is omitted from the output report. Thus, the user would receive an output report that would contain information on the BOM but would exclude unrequested information, such as a price list, etc. An essentially identical system is used to access information from the VirtualPartQuality objects 150 via the VirtualPartSpecifier object 242.

Information extracted from a Part object or a VirtualPart object by the PartSpecifier object 240 is used in conjunction with one or more of the following flags: Name 250, Quality 252, PartNumber 254, Level 256, or Comments 258, to name but a few. If the Name flag 250 is set, the name of the PartDescriptor object 230 is outputted on the line. If the Quality flag 252 is set, then all of the PartQuality objects for the corresponding Part object that have their Output flags 124 set will be included in the line of output. If PartNumber flag 254 is set, then the PartNumberManager object 102 of the corresponding Part object will be employed to derive a part number for the line of output. If no PartNumberManager object was set up, then the manually entered part number will be used. If the Level flag 256 is set, then the hierarchical level of the corresponding Part object within the Profile will be provided. Lastly, if the Comments flag is set, then any comments about that Part object, as provided by the modeler, will be provided on the output line.

The BatchPartDescriptor object 232 is similar to the PartDescriptor object 230, only this object is capable of providing an output report with multiple lines of output corresponding to a whole host of Part objects located in the Profile object 36, not just a single line of output corresponding to a single Part object. The BatchPartDescriptor object 232 includes a PartSummarySpecifier object 270 and a Constraint object 272. The PartSummarySpecifier object 270 includes a link to information found in the Profile object 36, but instead of providing a direct link to a specific Part object, this object allows a user to define a link that returns information from all Part objects meeting that criteria. For instance, a user can retrieve or exclude information for all Part objects having their Assembly flags 138 set. As before, the BatchPartDescriptor object 232 includes a Constraint object 272 that determines which lines of an output report will be included.

A CustomDescriptor object 234 capable of customizing the particular information included in an output report may also be provided. This CustomDescriptor object includes a CustomSpecifier object 280 and a Constraint object 282, and provides a user with the opportunity to construct either a textual or a mathematical expression for extracting information of the user's choice from a Profile object 36. As previously discussed, the Specifier object 280 includes a link to the particular information sought and the Constraint object 282 acts as a filter for determining which information will be included in the output report. It should be noted, the DescriptionManager object 38 shown in FIG. 8 and described above was for a BOM perspective, however, other perspectives could also be provided for. A DescriptionManager object for a price list, that is a list containing the price of each component of a particular product, and a DescriptionManager object for a description of the product are just some examples of other perspectives that could be provided for. Because of this architectural design, future perspectives can easily be added to support outputs not currently provided for. The next step in the creation of the ProductModel 16 is to set up the PartResources object 40.

The PartResources object 40 includes a list of preconfigured parts or assemblies that may be added to the Profile object 36 during configuration. These preconfigured assemblies are added to the ProductModel object 16 with all of their PartQualities already having specific values. Thus, they are not generic templates of parts, such as the PartType objects 32, still waiting to be populated with specific values. Rather, they are static models having predetermined values, sometimes referred to as being "off line". It is possible to store the various PartResources in a list instead of an object.

The last step in the creation of the ProductModel object 16 is a compilation of the various objects into a single electronic ProductModel file 16, such as one having a ".dpm" extension. Creation of the ".dpm" file can be accomplished by converting the class/object structure previously discussed into a binary format. An object-oriented programming language, such as the Java language from Sun Microsystems, would facilitate this conversion into binary format. Up until this point, the description of the present invention has been primarily directed to the structure of the ProductModel object 16. The process of entering information on a product line into the ProductModel object 16 is referred to as the "modeling" process. The description now turns to the process of configuring a specific product, extracting detailed information about that product, and utilizing that information in a particular manner. This process is referred to as the "configuration" process and is accomplished by the runtime tool 14.

Runtime Tool

The runtime tool 14 is a software layer that allows numerous types of external applications 18 to access and utilize the information stored within the ProductModel object 16. Stated differently, the runtime tool 14 is a binary library that can be used as an Application Programming Interface (API) for connecting a client application, or external application 18, to specific pieces of product information contained within the ProductModel. For instance, an external business application 18, such as an Enterprise Resource Planning (ERP) system, a product pricing application, a company web site, or a sales application, could utilize the runtime tool 14 to access the pieces of information needed by the output perspective corresponding to that particular application 18. Thus, the runtime tool 14 provides the product configuration system 10 with a tremendous amount of flexibility, particularly in situations where a manufacturer wants to use a variety of external applications but only wants to maintain a single source of information.

Figure 9:
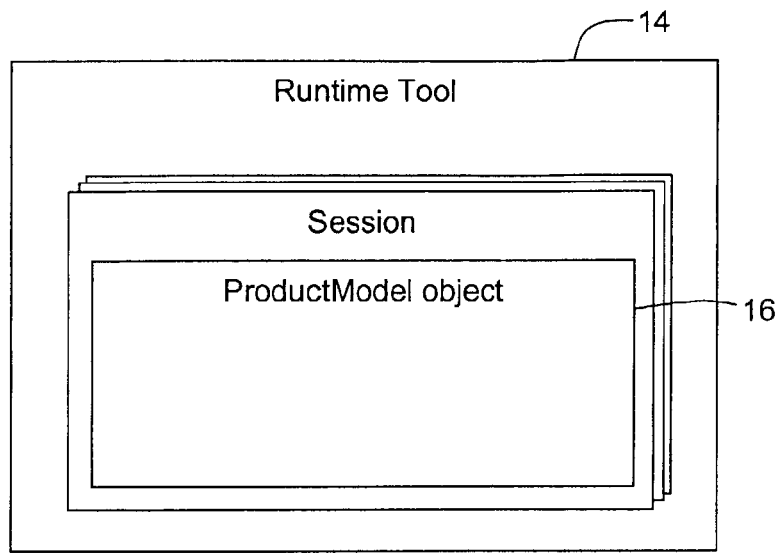
FIG. 9 is a block diagram showing an overview of a preferred embodiment of the runtime tool shown in FIG. 1.

With reference to FIG. 9, a general structural overview of an embodiment of the runtime tool 14 is seen. The runtime tool shown here has loaded several Session objects, which will be subsequently explained, each of which includes a ProductModel object 16. The information contained within the ProductModel object is used during the configuration process to generate an output report, which is then provided to an external application 18. In the previous description regarding the ProductModel object 16, that object was primarily described in terms of structure and architecture; in the following description, the runtime tool 14 will be primarily described in terms of functionality.

Figure 10:
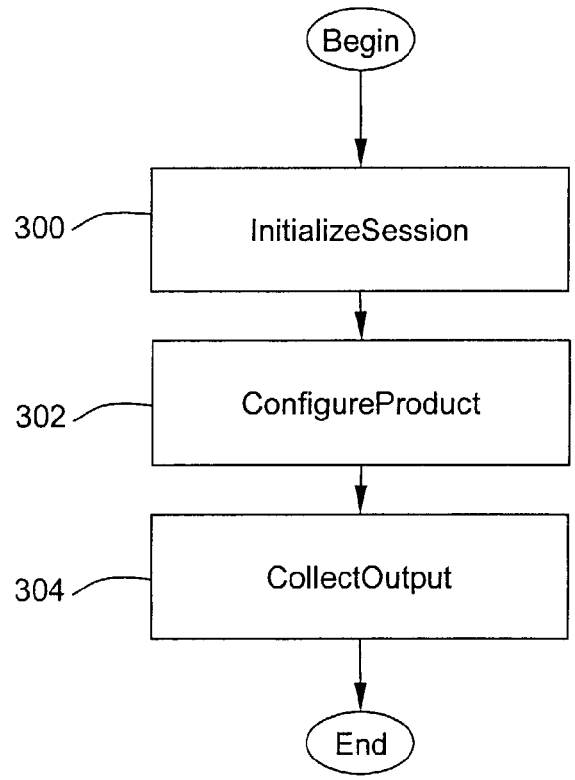
FIG. 10 is a flowchart showing an overview of a preferred embodiment of the functionality of the runtime tool shown in FIG. 9.

Turning now to FIG. 10, there is seen a general overview of the functionality of runtime tool 14, which includes the following main sequences: the InitializeSession sequence 300, the ConfigureProduct sequence 302, and the CollectOutput sequence 304. The InitializeSession sequence opens a session, which generally provides the context in which the runtime tool 14 configures a product. The process of configuring a product may comprise numerous individual exchanges of information, all of which are conducted within the context of the session and thus are identified by using a common session identifier, referred to as a SessionID. The ConfigureProduct sequence sends an inputted model number to the ProductModel object 16, which then configures a product if that model number corresponds to a valid product configuration. Once a product is configured, the CollectOutput sequence informs the ProductModel object 16 of which output information it is interested in, at which point, a corresponding DescriptionManager outputs the requested information. Needless to say, this is a very general overview and does not encompass all aspects of the runtime tool. For instance, there are numerous aspects pertaining to how the runtime tool handles information deficiencies, which are instances when the runtime tool does not have enough information to properly configure a product. The discussion now turns to a more detailed account of the first sequence in the configuration process, the InitializeSession sequence 300.

Figure 11:
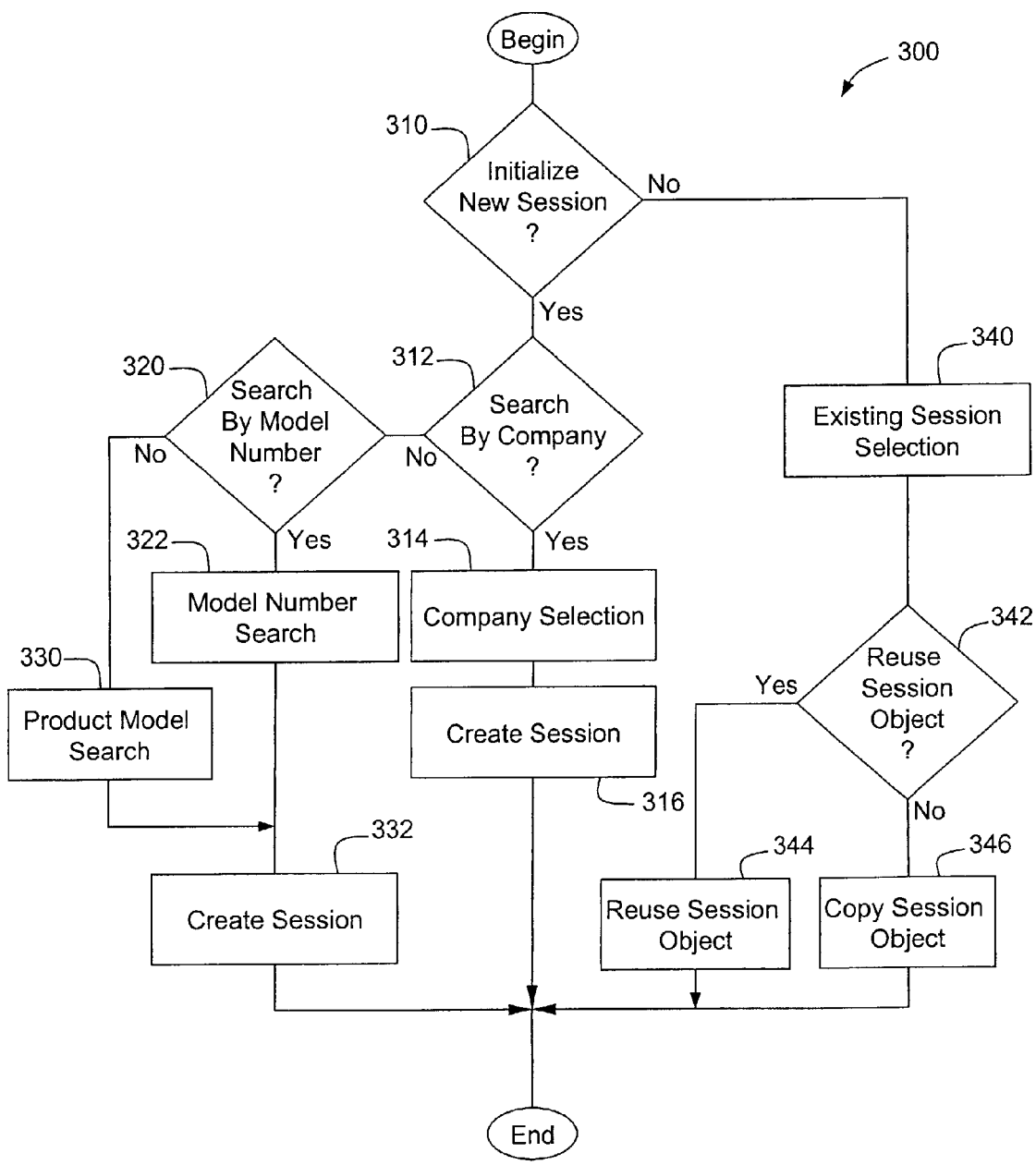
FIG. 11 is a flowchart showing a preferred embodiment of the InitializeSession sequence shown in FIG. 10.

A session can be thought of as a virtual production factory where the runtime tool 14 is used to configure products. The runtime tool can be used to create multiple sessions, limited only by memory, and each session may in turn have access to multiple ProductModel objects 16. However, only a single ProductModel object may be active at any one time. With reference to FIG. 11, the InitializeSession sequence 300 is seen in more detail, and generally allows for several ways in which to initialize a session.

First, the user must determine whether or not they want to initialize a new session or select from existing sessions, step 310. If the user chooses to initialize a new session, they must then select the method of doing so. The first decision involves whether or not the user wants to search by company, step 312. If the user decides to search by company, they are presented with the CompanySelection step 314, which provides a list of all of the companies available to the runtime tool 14. From this list, the user must select a particular company, which in turn determines which ProductModel objects will be available in this particular session. For example, if Company X is selected, only the ProductModel objects that are assigned to Company X are available. Next, the CreateSession step 316 is encountered which creates a Session object and provides access to all of the ProductModel objects of the selected company.

Returning to step 312, if the user decides not to search by Company, they still have several search options available. The first option involves searching by model number, step 320. If the user decides to search by model number, then ModelNumberSearch step 322 allows a user to enter either a fully or a partially, known model number. Like web search engines, the runtime tool 14 uses this model number to search each ProductModel object 16 and returns a list of ProductModel objects and a percentage match. The percentage match indicates whether or not that model number is valid with the ModelNumberManager object 30 of that particular ProductModel object. It should be noted, a session is not created with respect to each ProductModel object that is returned with a percentage match. Rather, the user must select a ProductModel object from this list which will subsequently be used to create a corresponding Session object.

Returning to step 320, if the user declines to search by model number, the only remaining option is to search by product model, step 330. There are several different ways in which a user may search by product model. For instance, the user could be presented with a list of the various ProductModel objects 16 available to the runtime tool, from which they could select one. Also, if the user knows a specific product model identifier, such as a name or code, they could input this information and the runtime tool could search the available ProductModel objects for a match. Regardless of the specific method used, once a specific ProductModel object 16 is selected, control passes to the CreateSession step 332. CreateSession step 332 is similar to CreateSession step 316, however, step 332 creates a Session object that provides access only to the single ProductModel object 16 just selected, where step 316 creates a Session object with access to all of the ProductModel objects of the selected company.

Referring back to step 310, if the user decides to select from existing Session objects, as opposed to creating a new one, then ExistingSessionSelection step 340 provides the user with a list of existing Session objects from which to choose. After a selection is made, the user must decide whether to reuse or to copy the existing Session object, step 342. If the user decides to reuse the Session object, they may modify and save over top of the existing, ReuseSessionObject step 344; if the user decides to copy the Session object, a duplicate copy is made and the original existing Session object is left untouched, CopySessionObject step 346. Regardless of which path the user choose in order to get from the beginning to the end of the InitializeSession sequence 300, by the time the user is ready to exit this sequence and progress to the ConfigureProduct sequence 302, a Session object has been initialized. This Session object determines which ProductModel objects 16 will subsequently be available during the configuration process. Additionally, the ModelNumberManager objects 30 of each available ProductModel objects has been initialized, as will now be explained.

Figure 12:
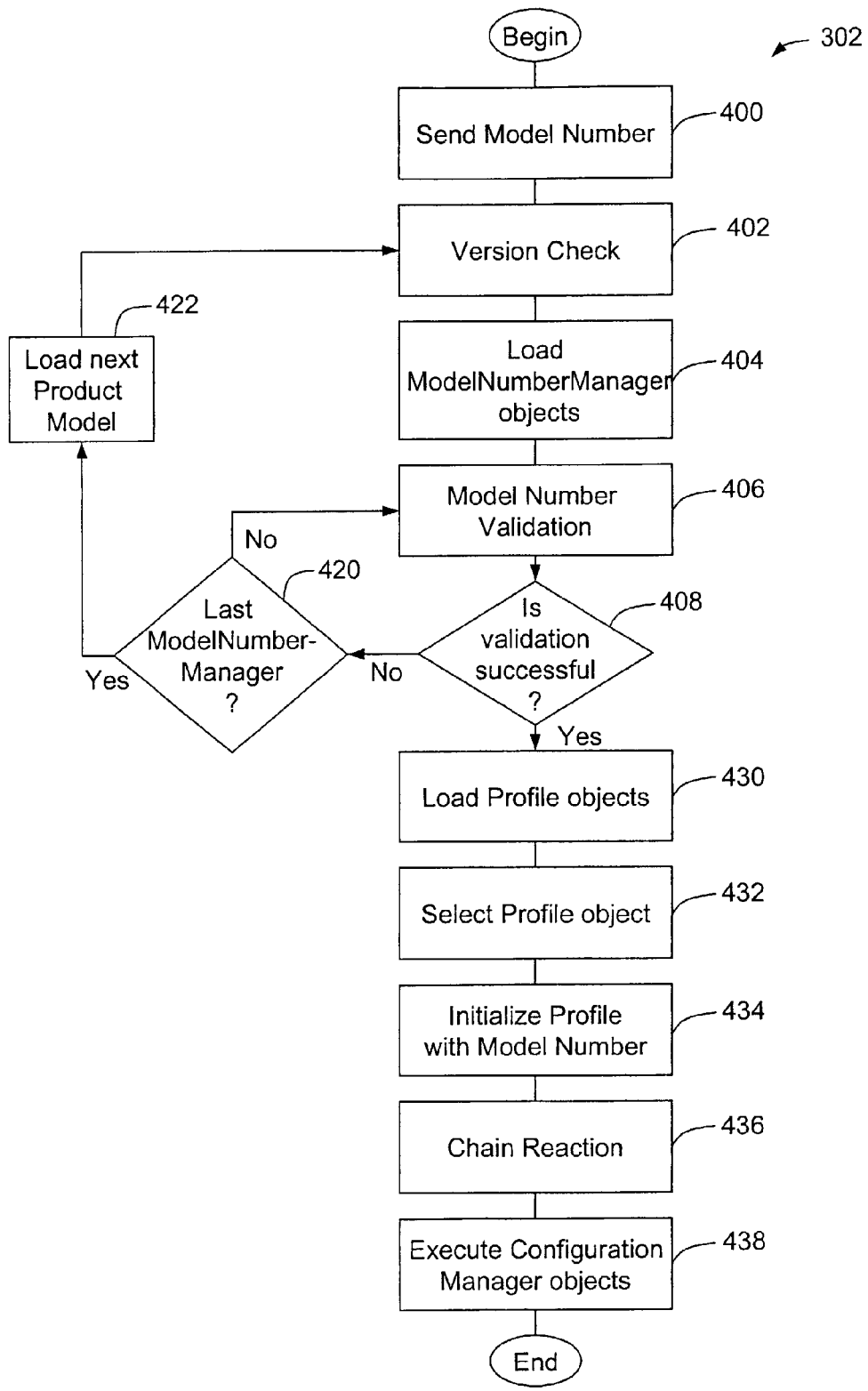
FIG. 12 is a flowchart showing a preferred embodiment of the ConfigureProduct sequence shown in FIG. 10.

With reference now to FIG. 12, there is seen the ConfigureProduct sequence 302 which implements the configuration process. The configuration process is where the runtime tool 14 sends an arbitrary string of characters, referred to as a model number, to a ProductModel object 16, which in turn transforms that string into a very detailed data model from which specific information may be retrieved. This process results in "product-enabling" the external application 18, that is, allowing a user of the external application to have knowledge of a product from an electronic standpoint. For instance, a product-enabled application 18 is capable of submitting a model number and retrieving a corresponding price, description of the product, or a bill of materials. The first step in the configuration process is to send a model number to a ProductModel object.

Step 400 provides the first ProductModel object 16 in the current session with the user-inputted model number. Next, step 402 checks the version of this ProductModel object, which is stored in Version string 224, to determine if it is compatible with this runtime tool version. If the two versions are incompatible, then an error message is returned and the ProductModel object 16 must be rebuilt with an appropriate version of the model tool 12. Assuming the ProductModel object in question and the runtime tool are compatible, step 404 loads all of the ModelNumberManager objects 30 located within that ProductModel object 16. Beginning with the first loaded ModelNumberManager object, the process of horizontal and vertical model number validation begins, as previously discussed. According to this process, all of the CharacterSegment objects 54 in the loaded ModelNumberManager are initially deactivated. After which they are arranged according to their order, which is determined by the integer stored in the Position string 86. If two or more CharacterSegment objects are located in the same position, they are ordered such that those CharacterSegment objects having CharacterContingency objects 62 are considered before those without CharacterContingency objects. The inputted model number is then parsed out to fill each of the CharacterSegment objects 54 according to their newly determined order and the length of each CharacterSegment, as determined by the string Initial Character 86. At this point, a CharacterSegment object 54 must be selected for each position, or character segment 52, in the model number. If multiple CharacterSegment objects exist for a single position, then the first CharacterSegment whose CharacterContingency evaluates to true will be selected and consequently activated. Following activation of a specific CharacterContingency object 62, the corresponding ValueSpecifier object 60 also evaluates the parsed character segment 52 of the inputted model number, step 408. If this validation is unsuccessful, thus indicating that the inputted model number represents an invalid product configuration, then the sequence proceeds to step 420.

Step 420 tests to see if the previous ModelNumberManager object 30 was the last one of the ProductModel object in question. If there are more ModelNumberManager objects in that ProductModel, then they are initialized and the validation is repeated according to the process just described. This sequence of steps, 406, 408, 420 continues until either a ModelNumberManager object is found to validate the inputted model number, or the ProductModel in question runs out of ModelNumberManagers. If the latter is the case, step 422 loads the next ProductModel object in the current session and the process is repeated. This continues until a ModelNumberManager object is found to validate the inputted model number, at which point, the ConfigureProduct sequence 302 advances to step 430. If no ModelNumberManager is found to validate the inputted model number, the user is presented with an appropriate error message.

Now that a model number has been validated, the runtime tool 14 must select the corresponding Profile object(s). The first step, step 430, involves loading all of the Profile objects into the current session that are listed in ProfileList 82. From these loaded Profile objects, one must be selected, step 432. If the ProductModel object in question only contains a single Profile object 36, then that Profile object is selected. However, in the event that the ProductModel object contains multiple Profile objects and there is no CharacterSegment object 54 specifically designated as a "Profile Segment", then the first Profile object listed in the Profile list 82 is selected. If there is a CharacterSegment object 54 specifically dedicated to identifying a corresponding Profile object, then the ModelSpecifier object 64 of that segment will be used to determine which Profile object to select. At this point, the selected Profile object must be initialized with information from the inputted model number, step 434. It should be noted, the Profile object is currently represented by part structure, but lacks specific values, such as dimensions, and potentially optional parts yet to be added. The inputted model number is parsed out into various character segments 52, and each of those segments are infused into a corresponding CharacterSegment object 54. This begins an important part of the configuration process, where the ModelSpecifier object 64 of each CharacterSegment is used to connect the character information in the model number to the appropriate place in the Profile object. There are different categories of ModelSpecifier objects 64. For instance, a ModelSpecifier object that is of a PartQualitySpecifier category directs the characters of the corresponding character segment to a PartQuality object 100 in the selected Profile object. A ModelSpecifier object of a PartSpecifier category adds a new Part object to the Profile from the list of available PartType objects. Alternatively, a ModelSpecifier object of a VirtualPartSpecifier category adds a new VirtualPart object to the VirtualPartsList 220 located in the FinalAssemblyPart object 180 from the available VirtualPart objects 182 located in the overall Profile object 36. Once all of the character segments 52 of the inputted model number have been linked to certain objects within the Profile, the model now in a "critical state". At this point, the information from the Model number must be propagated throughout the Profile object.

Step 436 involves the act of setting specific values for PartQuality objects 100, thereby causing a chain-reaction that fills values of other PartQuality objects throughout the structural hierarchy. Beginning with so-called "primary" PartQuality objects, or PartQuality objects at the top of the structural hierarchy, values corresponding to the inputted character segments are entered and those values are then spread throughout the FinalAssembly via InputSpecifier objects 110. Consequently, a self-configuring process takes place where all "active" PartQuality objects 100, as previously discussed, within the FinalAssembly object are populated with specific values. Once this process is complete, the ConfigurationManager objects should be executed.

The ConfigurationManager objects 200 are utilized to take into account any PartQuality objects whose value cannot be directly determined from the inputted model number, as previously discussed. Thus, each Part object 184 that contains a "passive" PartQuality object, that is, an object whose value is not directly linked for automatic, chain-reaction filling of that value, executes a corresponding ConfigurationManager object 200. That object provides for otherwise undefined values, and may also add or remove Part objects that were indeterminable during design. Moreover, if additional information is still required in order to properly configure the product, a condition known as a deficiency, then an error message and possibly a user interface will be presented to the user indicating the information that is needed. The user interface may be in the form of an input box, a list selector box, or any other suitable form. Following the execution of the ConfigurationManager objects of the Part objects, the runtime tool executes those ConfigurationManager objects located in the VirtualPart objects added to the FinalAssemblyPart object 180 during the configuration process. This process is largely the same as that just described, thus a full description has been omitted. Once again, any non-initialized ConfigurationManager objects can be executed such that they are able to modify the part structure in accordance with the selected option or other modification represented by the corresponding VirtualPart object. Once this step has been completed, the model is said to be in an "established state", that is, it represents a specific product in great detail and is ready to be queried such that it may provide desired output information.

Figure 13:
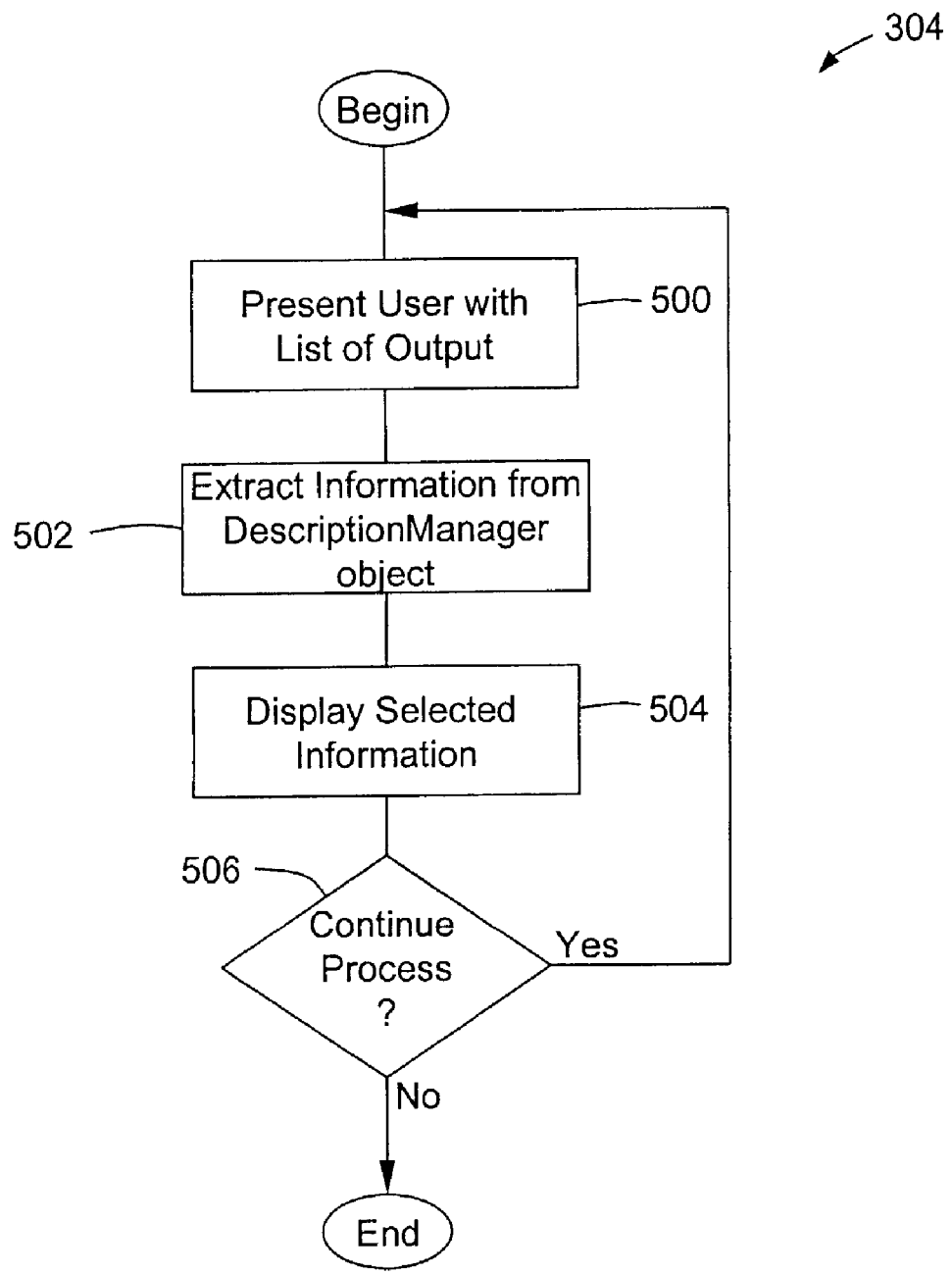
FIG. 13 is a flowchart showing a preferred embodiment of the CollectOutput sequence shown in FIG. 10.

With reference now to FIG. 13, there is seen the CollectOutput sequence 304, which, generally speaking, determines what information will be extracted from the configured product and presented to the user of the external application 18. First, the user is presented with a list showing all of the output information available for selection, step 500. This list may be a compilation of the various Name strings 250 contained within each DescriptionManager object 38. Once the desired output information has been selected, step 502 extracts the selected information from the corresponding DescriptionManager object 38, as previously discussed in connection with FIG. 8. At this point, the runtime tool now retains the desired output information and step 504 displays that information to the user according to one of numerous methods known in the art. For instance, that information may be provided in the form of an output report to the user's computer monitor, to a printer, to some type of electronic storage medium, etc. Furthermore, the type of information extracted could range from a price list to a bill of materials to a dimensional description of the product. Whatever the case may be, the user has now configured a product and used that configuration to selectively extract specific information. Step 506 provides the user with the opportunity to continue selecting and extracting output information from the configured product until they no longer desire to do so, at which point the configuration process ends.

Following the CollectOutput sequence 304, the user should be provided with an opportunity to close either the session that was just completed or all sessions currently opened. If closed, the session will be shutdown and removed from the memory. Also, a function for clearing a product configuration should be provided which will simply flush a particular product configuration from a session, without closing the session. In the event of a program crash (or if there are file errors reported from the product model object), it is suggested that a close product model function be provided to insure that the operating system is fully aware of the intended request for a "clean slate".

It will thus be apparent that there has been provided in accordance with the present invention an object-oriented product configuration system and method which achieves the aims and advantages specified herein. It will, of course, be understood that the foregoing description is of a preferred exemplary embodiment of the invention and that the invention is not limited to the specific embodiment shown. For example, the structure of the model tool 12, runtime tool 14, ProductModel object 16, and all of their various sub-components could vary from that shown in the Figures and discussed in the specification. Objects, data, functions, logic, etc. could be added, omitted, or otherwise altered from that specifically shown. Also, there are numerous instances where information is said to be stored in the form of a particular value, string, flag, etc. These values could just as easily be stored in the form of additional objects, or any other type of data known in the art. Moreover, the particular sequences, steps, etc. and their corresponding order of execution could differ from that previously discussed, as the embodiments shown herein were merely intended as an example. Various changes and modifications are intended to be within the scope of the present invention.

The invention claimed is:

1. A method of configuring a product, said method comprising the steps of:
   (a) creating an electronic object-oriented product model representative of a product line with a first software tool that is installed on a computer, wherein:
      (i) said product model includes an electronic profile model representative of a product within the product line;
      (ii) said profile model includes an electronic part model representative of a part within the product;
      (iii) said part model includes an electronic part quality model representative of an attribute of the part; and
      (iv) said product model further includes a model number manager having one or more character segments that treat portions of a meaningful model number separately, said model number manager performs at least one of the following steps:
         1) utilizing the meaningful model number to access information stored in said object-oriented product model; or
         2) generating a meaningful model number from information stored in said object-oriented product model; and
   (b) making the information stored in said product model available to one or more software applications with a second software tool that is installed on a computer, wherein each of said one or more character segments is capable of exchanging information with said part quality model, and a first character segment is capable of validating the portion of the meaningful model number by exchanging information with a second character segment, a process referred to as horizontal validation.

2. The method of claim 1, wherein said first character segment is also capable of validating the portion of the meaningful model number without exchanging information with another character segment, a process referred to as vertical validation.

3. The method of claim 1, wherein the portion of the meaningful model number may include one or more individual model number characters.

4. The method of claim 1, wherein said product model includes a collection of one or more electronic part type models, each of which is representative of a part template and is available for selection to be included within said profile model.

5. The method of claim 4, wherein said part type model becomes said part model when selected and included in said profile model.

6. The method of claim 1, wherein said product model includes a collection of one or more electronic virtual part type models, each of which is representative of an available modification and is available for selection to be included within said profile model.

7. The method of claim 6, wherein said virtual part type model becomes a virtual part model when selected and included in said profile model.

8. The method of claim 6, wherein said virtual part type model is representative of an available option package.

9. The method of claim 7, wherein said profile model includes an electronic configuration manager capable of implementing modifications to said profile model not otherwise provided for by said virtual part model.

10. The method of claim 1, wherein a first part quality model is electronically connected to a second part quality model such that they are capable of exchanging information.

11. The method of claim 10, wherein the exchange of information occurs during the use of said second software tool such that the information is automatically distributed through said profile model.

12. The method of claim 11, wherein said part quality model includes an electronic filter capable of converting one type of information to another such that said filter assists in the automatic distribution of information.

13. The method of claim 1, wherein said part model includes an electronic part number manager capable of providing a meaningful part number.

14. The method of claim 1, wherein said product model includes an electronic description manager capable of controlling which information will be made available to a software application during use of said second software tool.

15. The method of claim 14, wherein said description manager includes an electronic part descriptor that is electronically connected to said part quality model such that they are capable of exchanging information.

16. The method of claim 14, wherein said description manager includes an electronic batch part descriptor capable of accepting criteria and making information only from part quality models satisfying said criteria available to one or more software applications.

17. The method of claim 1, wherein said electronic object-oriented product model stores both logic and data in a single object.

18. The method of claim 1, wherein said first and second software tools can be part of a stand alone product configuration system.

19. The method of claim 1, wherein said second software tool is capable of making the same information available to a first software application and a second software application, where first and second software applications are of different types.

20. The method of claim 1, wherein a software application can input a model number to said second software tool, said second software tool can provide the inputted model number to said product model, and said product model can determine if the inputted model number is valid according to a meaningful model number scheme.

21. The method of claim 20, wherein if the inputted model number is valid, said product model can provide said second software tool with an output, and said second software tool can provide the output to the software application.

22. A non-transitory computer-readable medium having stored thereon computer executable instructions for performing the method of claim 1.

* * * * *